United States Patent
Yamazaki et al.

(10) Patent No.: US 7,432,116 B2
(45) Date of Patent: Oct. 7, 2008

(54) METHOD AND APPARATUS FOR FILM DEPOSITION

(75) Inventors: Shunpei Yamazaki, Tokyo (JP); Satoshi Seo, Kanagawa (JP); Noriko Shibata, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 10/081,971

(22) Filed: Feb. 20, 2002

(65) Prior Publication Data

US 2002/0155632 A1 Oct. 24, 2002

(30) Foreign Application Priority Data

Feb. 21, 2001 (JP) .................. 2001-044650

(51) Int. Cl.
*H01L 21/20* (2006.01)
(52) U.S. Cl. .................. 438/22; 438/479
(58) Field of Classification Search .......... 438/99, 438/479, 585, 758, 7, 22, 141
See application file for complete search history.

(56) References Cited

U.S. PATENT DOCUMENTS

| | | | |
|---|---|---|---|
| 3,654,525 A | 4/1972 | Maricle et al. | |
| 5,017,863 A | 5/1991 | Mellitz | |
| 5,039,657 A | 8/1991 | Goldman et al. | |
| 5,084,130 A | 1/1992 | Yamazaki et al. | |
| 5,170,990 A | 12/1992 | Kamiya et al. | |
| 5,256,945 A | 10/1993 | Imai et al. | |
| 5,271,089 A | 12/1993 | Ozawa | |
| 5,281,489 A | 1/1994 | Mori et al. | |
| 5,486,406 A | 1/1996 | Shi | |
| 5,513,499 A | 5/1996 | deRijke | |
| 5,719,467 A | 2/1998 | Antoniadis et al. | |
| 5,817,431 A | 10/1998 | Shi et al. | |
| 5,853,905 A | 12/1998 | So et al. | |
| 5,858,563 A | 1/1999 | Sano et al. | |
| 5,925,472 A | 7/1999 | Hu et al. | |
| 5,925,980 A | 7/1999 | So et al. | |
| 5,955,836 A | 9/1999 | Boerner et al. | |
| 5,989,737 A | 11/1999 | Xie et al. | |
| 6,030,715 A | 2/2000 | Thompson et al. | |

(Continued)

FOREIGN PATENT DOCUMENTS

EP 1 011 155 A2 6/2000

(Continued)

OTHER PUBLICATIONS

Tang et al. "Organic electroluminescent diodes." Applied Physics Letters 51(12): 1987. p. 913-915.

(Continued)

*Primary Examiner*—Savitri Mulpuri
(74) *Attorney, Agent, or Firm*—Fish & Richardson P.C.

(57) ABSTRACT

Provided is a method and apparatus for depositing an organic compound layer having a plurality of function regions. A plurality of evaporation sources are provided within a deposition chamber. Function regions of respective organic compounds can be continuously formed and a mixed region be formed in an interface between the function regions. Meanwhile, a light source is provided in a deposition chamber to perform deposition while irradiating light to an anode surface, thereby forming a compact organic compound layer.

5 Claims, 21 Drawing Sheets

U.S. PATENT DOCUMENTS

| | | | |
|---|---|---|---|
| 6,097,147 A | 8/2000 | Baldo et al. | |
| 6,121,727 A | 9/2000 | Kanai et al. | |
| 6,130,001 A | 10/2000 | Shi et al. | |
| 6,132,280 A * | 10/2000 | Tanabe et al. | 445/58 |
| 6,215,462 B1 | 4/2001 | Yamada et al. | |
| 6,228,228 B1 | 5/2001 | Singh et al. | |
| 6,237,529 B1 * | 5/2001 | Spahn | 204/298.02 |
| 6,275,649 B1 * | 8/2001 | Nagashima et al. | 392/389 |
| 6,284,050 B1 * | 9/2001 | Shi et al. | 427/520 |
| 6,285,039 B1 | 9/2001 | Kobori et al. | |
| 6,310,360 B1 | 10/2001 | Forrest et al. | |
| 6,326,091 B1 | 12/2001 | Schoo et al. | |
| 6,368,730 B1 | 4/2002 | Kishimoto et al. | |
| 6,372,154 B1 | 4/2002 | Li | |
| 6,392,250 B1 | 5/2002 | Aziz et al. | |
| 6,392,339 B1 | 5/2002 | Aziz et al. | |
| 6,396,209 B1 | 5/2002 | Kido et al. | |
| 6,413,656 B1 | 7/2002 | Thompson et al. | |
| 6,432,255 B1 | 8/2002 | Sun et al. | |
| 6,458,475 B1 | 10/2002 | Adachi et al. | |
| 6,468,676 B1 | 10/2002 | Ueda et al. | |
| 6,495,198 B2 | 12/2002 | Peng | |
| 6,517,996 B1 | 2/2003 | Chao et al. | |
| 6,528,824 B2 | 3/2003 | Yamagata et al. | |
| 6,541,909 B1 | 4/2003 | Motomatsu | |
| 6,566,807 B1 | 5/2003 | Fujita et al. | |
| 6,603,140 B2 | 8/2003 | Kobori et al. | |
| 6,614,175 B2 | 9/2003 | Aziz et al. | |
| 6,759,144 B2 | 7/2004 | Toguchi et al. | |
| 6,774,574 B1 | 8/2004 | Koyama | |
| 6,777,887 B2 | 8/2004 | Koyama | |
| 6,803,720 B2 | 10/2004 | Kwong et al. | |
| 2001/0051207 A1 | 12/2001 | Yamagata et al. | |
| 2002/0018912 A1 * | 2/2002 | Jung et al. | 428/690 |
| 2002/0038867 A1 | 4/2002 | Kobori et al. | |
| 2002/0074935 A1 | 6/2002 | Kwong et al. | |
| 2002/0081767 A1 * | 6/2002 | Kawashima | 438/99 |
| 2002/0086180 A1 | 7/2002 | Seo et al. | |
| 2002/0093283 A1 | 7/2002 | Seo et al. | |
| 2002/0101154 A1 | 8/2002 | Seo et al. | |
| 2002/0105005 A1 | 8/2002 | Seo et al. | |
| 2002/0109136 A1 | 8/2002 | Seo et al. | |
| 2002/0113546 A1 | 8/2002 | Seo et al. | |
| 2002/0121860 A1 | 9/2002 | Seo et al. | |
| 2002/0139303 A1 | 10/2002 | Yamazaki et al. | |
| 2002/0155632 A1 | 10/2002 | Yamazaki et al. | |
| 2003/0118950 A1 | 6/2003 | Chao et al. | |
| 2003/0134145 A1 | 7/2003 | Toguchi et al. | |
| 2004/0207331 A1 | 10/2004 | Koyama | |

FOREIGN PATENT DOCUMENTS

| | | |
|---|---|---|
| EP | 1 063 630 | 12/2000 |
| EP | 1 065 737 | 1/2001 |
| EP | 1 220 340 | 7/2002 |
| JP | 62-274063 | 11/1987 |
| JP | 02-081033 | 3/1990 |
| JP | 03-114197 | 5/1991 |
| JP | 04-357694 | 12/1992 |
| JP | 06-279991 | 10/1994 |
| JP | 07-335616 | 12/1995 |
| JP | 09-031115 | 2/1997 |
| JP | 09-232077 | 9/1997 |
| JP | 10-233288 | 9/1998 |
| JP | 2000-208262 | 7/2000 |
| JP | 2000-313952 | 11/2000 |
| JP | 2001-005426 | 1/2001 |
| JP | 2001-023776 | 1/2001 |
| JP | 2001-52870 | 2/2001 |
| JP | 2002-151259 | 5/2002 |
| TW | 243470 | 3/1995 |
| TW | 366598 | 8/1999 |
| TW | 451601 | 8/2001 |
| WO | WO98-08360 | 2/1998 |
| WO | WO02-47457 | 6/2002 |

OTHER PUBLICATIONS

Kijima et al. "A blue organic light emitting diode." Jpn. J. Appl. Phys. 38: 1999. p. 5274-5277.

C. Adachi et al. "Electroluminescence in organic films with three-layer structure." Jpn. J. Appl. Phys. 27(2): 1988. p. L269-L271.

C.W. Tang et al. "Electroluminescence of doped organic thin films." J. Appl. Phys. 65(9): 1989. p. 3610-3616.

"New Aspect of Research and Development of Organic EL." M&BE Seminar, Bulletin of Organic Molecular/Bioelectronics Subcommittee, Society of Applied Physics, 11(1): 2000. p. 3-12.

T. Wakimoto et al. "Organic EL cells using alkaline metal compounds as electron injection materials." IEEE Transactions on Electron Devices 44(8): 1997. p. 1245-1248.

S.A. Van Slyke et al. "Organic electroluminescent devices with improved stability." Appl. Phys. Lett. 69(15): 1996. p. 2160-2162.

D.F. O'Brien et al. "Improved energy transfer in electrophosphorescent devices." Appl. Phys. Lett. 74(3): 1999. p. 442-444.

T. Tsutsui et al. "High quantum efficiency in organic light-emitting devices with iridium-complex as a triplet emissive center." Jpn. J. Appl. Phys. 38: 1999. p. L1502-L1504.

T. Tsutsui et al. "The operation mechanism and the light emission efficiency of the organic EL element." Text of the Third Lecture Meeting, Bulletin of Organic Molecular/Bioelectronics Subcommittee, Society of Applied Physics, p. 31-37.

J. Kido et al. "Multilayer white light-emitting organic electroluminescent device." Science 367: 1995. p. 1332-1334.

Satoshi Seo et al., U.S. Appl. No. 10/043,786, filed Jan. 10, 2002.
Satoshi Seo et al., U.S. Appl. No. 10/043,812, filed Jan. 10, 2002.
Satoshi Seo et al., U.S. Appl. No. 10/060,427, filed Jan. 29, 2002.
Shunpei Yamazaki et al., U.S. Appl. No. 10/062,005, filed Jan. 31, 2002.
Satoshi Seo et al., U.S. Appl. No. 10/072,507, filed Feb. 5, 2002.
Shunpei Yamazaki et al., U.S. Appl. No. 10/072,310, filed Feb. 5, 2002.
Satoshi Seo et al., U.S. Appl. No. 10/081,558, filed Feb. 20, 2002.
Hirokazu Yamagata et al., U.S. Appl. No. 09/852,090, filed May 10, 2001.
Satoshi Seo et al., U.S. Appl. No. 10/026,064, filed Dec. 21, 2001.
Satoshi Seo et al., U.S. Appl. No. 10/024,699, filed Dec. 21, 2001.

Takeshi Nishi et al., "High Efficiency TFT-OLED Display with Iridium-Complex As Triplet Emissive Center", *Proceedings of the 10th International Workshop on Inorganic and Organic Electroluminescence*, pp. 353-356, Dec. 4-7, 2000.

Australian Patent Office Search Report (SG 200200037-0), dated Oct. 7, 2003.

Australian Patent Office Search Report (SG 200202969-2), dated Apr. 27, 2004.

Office Action (Japanese Patent Application No. 2002-042851) mailed Aug. 28, 2007 with translation.

Office Action (Korean Patent Application No. 2002-0009200) mailed Dec. 17, 2007; 8 pages with full English translation.

* cited by examiner

FIG. 1A   FIG. 1B

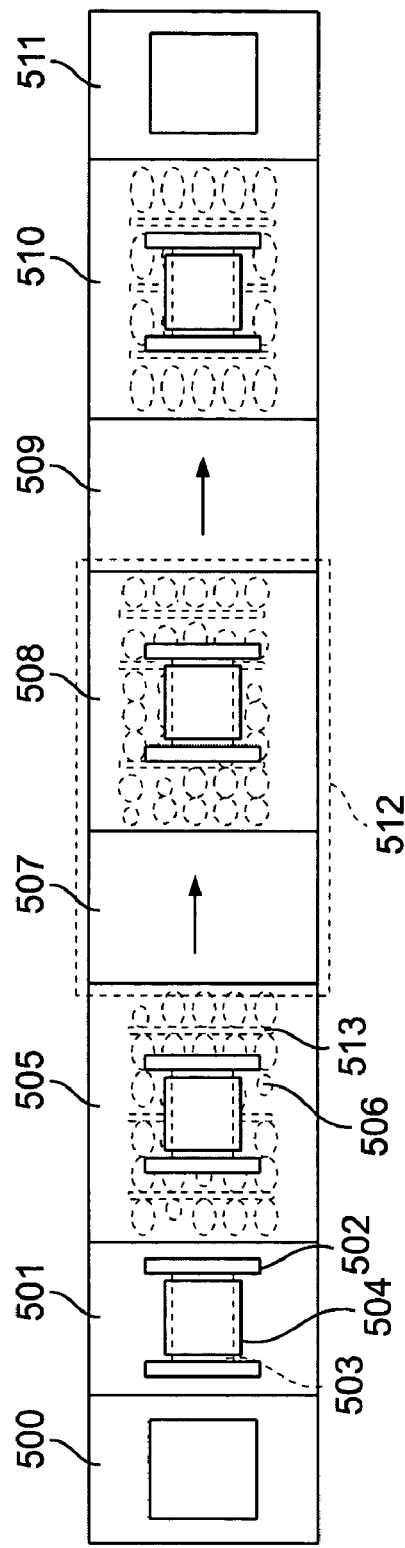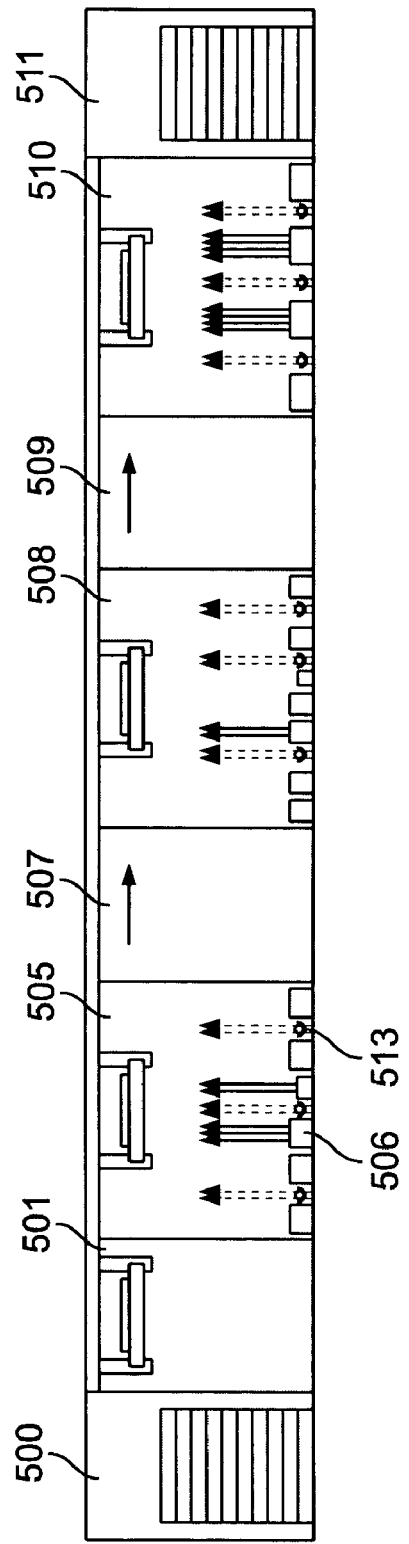
FIG. 5A
FIG. 5B

FIG. 9A          FIG. 9B

METHOD AND APPARATUS FOR FILM DEPOSITION

BACKGROUND OF THE INVENTION

1. Field of the Invention

The invention relates to a luminescent device using an organic luminescent element having an anode, a cathode, and a film (referred below to as "organic compound layer"), which includes an organic compound adapted to effect luminescence upon application of an electric field. Specifically, the present invention relates to a manufacturing of a luminescent element which requires a lower drive voltage and has a longer life than luminescent devices of the related art. Further, the luminescent device described in the specification of the present application indicates an image display device or a luminescent device, which use an organic luminescent element as luminescent element. Also, the luminescent device includes all of modules, in which a connector, for example, an anisotropic electroconductive film (FPC:Flexible printed circuit) or a TAB (Tape Automated Bonding) tape or a TCP (Tape Carrier Package) is mounted to an organic luminescent element, modules, in which a printed-circuit board is provided on a TAB tape or a tip end of a TCP, or modules, in which an IC (integrated circuit) is directly mounted on an organic luminescent element in the COG (Chip On Glass) system.

2. Description of the Related Art

An organic luminescent element is one adapted to effect luminescence upon application of an electric field. A mechanism for luminescence has been said to reside in that an organic compound layer is interposed between electrodes, upon application of voltage thereto electrons filled from a cathode and holes filled from an anode recombine together at a center of luminescence in the organic compound layer to form molecule excitons, and the molecule excitons discharge energy to produce luminescence when returned to the base state.

In addition, kinds of molecule excitons formed by the organic compound can include a singlet excited state and a triplet excited state, while the specification of the present invention contains the case where either of the excited states contributes to luminescence.

In such organic luminescent element, an organic compound layer is normally formed in a thin film below 1 μm. Also, since the organic luminescent element is a self-luminescent type one, in which the organic compound layer itself emits light, a backlight used in a conventional liquid crystal display is not necessary. Accordingly, the organic luminescent element can be very advantageously formed to be thin and lightweight.

Also, with, for example, an organic compound layer of about 100 to 200 nm in thickness, a time period having elapsed from filling of a carrier to recombination thereof is in the order of several tens of nanosecond taking account of the extent of movement of the carrier in the organic compound layer, and luminescence is achieved in the order of less than one micro second even when the procedure from the recombination of the carrier to luminescence is included. Accordingly, one of the features is that the speed of response is very large.

Further, since the organic luminescent element is a carrier-filling type luminescent element, it can be driven by DC voltage, and is hard to generate noise. With respect to drive voltage, an adequate luminance of 100 cd/m$^2$ is achieved at 5.5 V by first making the thickness of an organic compound layer a uniform, super-thin film of around 100 nm, selecting an electrode material, which reduces a carrier filling barrier relative to the organic compound layer, and further introducing a single hetero structure (double structure) (Literature 1: C. W. Tang and S. A. VanSlyke, "Organic electroluminescent diodes", Applied Physics Letters, vol. 51, No. 12, 913-915 (1987)).

Owing to such performances as thin and lightweight, high-speed responsibility. DC low voltage drive, and the like, organic luminescent elements have been given attention as next-generation flat panel display elements. Also, since organic luminescent elements are of self-luminescent type and large in angle of visibility, they are comparatively favorable in visibility and believed to be effective as elements used for displays in portable equipments.

Hereupon, in the constitution of an organic luminescent element described in Literature 1, a carrier filling barrier is made small by using as a cathode a relatively stable Mg:Ag alloy of low work function to enhance an electron injecting quality. This makes it possible to fill a large amount of carrier into the organic compound layer.

Further, the recombination efficiency of the carrier is improved by leaps and bounds by application of a single hetero structure, in which a hole transporting layer composed of a diamine compound and an electron transporting luminescent layer composed of tris (8-quinolinolato) aluminium (hereinafter written as "Alq$_3$") are laminated as an organic compound layer, which is explained below.

In the case of, for example, an organic luminescent element having only a single Alq$_3$ layer, a major part of electrons filled from a cathode reaches an anode without recombining with holes, making the luminescent efficiency very low, since Alq$_3$ is of electron transporting quality. That is, in order to have the single-layered organic luminescent element efficiently emitting light (or driving at low voltage), it is necessary to use a material (referred below to as "bipolar material") capable of carrying both electrons and holes in well-balanced manner, and Alq$_3$ does not meet such requirement.

However, application of the single hetero structure described in Literature 1 causes electrons filled from a cathode to be blocked by an interface between the hole transporting layer and the electron transporting luminescent layer to be enclosed in the electron transporting luminescent layer. Accordingly, the carrier is efficiently recombined in the electron transporting luminescent layer to provide for efficient luminescence.

When the concept of such carrier blocking function is developed, it becomes possible to control a carrier recombining region. As an example, there is a report. according to which success is achieved in enclosing holes in a hole transporting layer and making the hole transporting layer luminescent by inserting a layer (hole blocking layer), which is capable of blocking holes, between the hole transporting layer and an electron transporting layer (Literature 2: Yasunori KIJIMA, Nobutoshi ASAI and Shin-ichiro TAMURA, "A Blue Organic Luminescent Diode", Japanese Journal of Applied Physics, Vol. 38, 5274-5277 (1999)).

Also, it can be said that the organic luminescent element described in Literature 1 is based on, so to speak, that thought of function separation, according to which carrying of holes is performed by the hole transporting layer and carrying and luminescence of electrons are performed by the electron transporting luminescent layer. Such concept of function separation has further grown to a concept of double hetero-structure (three-layered structure), according to which a luminescent layer is inserted between the hole transporting layer and the electron transporting layer (Literature 3: Chihaya ADACHI, Shizuo TOKITO, Tetsuo TSUTSUI and Shogo SAITO, "Electroluminescence in Organic Films with Three-Layered Structure", Japanese Journal of Applied Physics, Vol. 27, No. 2, L269-L271 (1988)).

Such function separation has an advantage in that the function separation makes it unnecessary for a kind of organic material to have a variety of functions (luminescence, carrier carrying quality, filling quality of carrier from electrode, and so on) at a time, which provides a wide freedom in molecular design or the like (for example, it is unnecessary to unreasonably search for bipolar materials). That is, a high luminous efficiency can be easily attained by combining materials having a good luminous quality and a carrier carrying quality, respectively.

Owing to these advantages, the concept of the laminated structure (carrier blocking function or function separation) itself described in Literature 1 has been widely utilized till now.

It is also noted that in the fabrication of these luminescent elements, in particular in mass-production processes, a deposition apparatus of the in-line type (multi-chamber scheme) is typically employed in order to prevent contamination of respective materials upon lamination of a hole transport material and a luminescent material, and an electron transport material or the like by vacuum evaporation. Additionally an upper plan view of such deposition apparatus is shown in FIG. 16.

In the deposition apparatus shown in FIG. 16, it is possible to perform a vacuum evaporation of a cathode and a three-layer lamination structure (double-heterostructure) of a hole transport layer and a luminescent layer, and an electron transport layer on a substrate having an anode (such as ITO or else), and to perform a sealing processing thereof.

Firstly, transfer a substrate with the anode into a carry-in chamber. The substrate is transferred through a first transfer chamber toward an ultraviolet ray irradiation chamber, and is then subjected to cleaning treatment on the surface of such anode, by irradiation of ultraviolet rays in a vacuum environment. Note here that in case the anode is made of oxides such as ITO, the anode is oxidized here in a pretreatment chamber.

Next, a hole transport layer is formed in a vapor evaporation chamber 1501 while forming luminescent layers (in FIG. 16, three colors of red, green and blue) in vacuum evaporation chambers 1502 to 1504, and forming an electron transport layer in a vacuum evaporation chamber 1505, and then forming a cathode in a vacuum evaporation chamber 1506. Lastly, sealing processing is carried out in a sealing chamber, thereby obtaining a luminescent element from a carry-out chamber.

One feature unique to the deposition apparatus of the inline type is that vacuum evaporation of respective layers is being performed in different vacuum evaporation chambers 1501 to 1505 respectively. Accordingly, each of the vacuum evaporation chambers 1501 to 1505 may ordinarily be provided with a single evaporation source (1511 to 1515) (note however that in the vacuum evaporation chambers 1302 to 1304, two evaporation sources will possibly be required from time to time for formation of a co-vacuum evaporation layer in the case of fabrication of a luminescent layer by doping pigment thereinto). To be brief, a specific apparatus arrangement is employed, in which materials of respective layers are hardly mixed into each other.

A structure of a luminescent element manufactured using the deposition apparatus described in FIG. 16 is shown in FIGS. 17A and 17B. In FIGS. 17A and 17B, an organic compound layer 1604 is formed between an anode 1602 which are formed on a substrate 1601 and a cathode 1603. Here, with respect to the formed organic compound layer 1604, different organic compounds are formed in different evaporation chambers. Thus, laminate interfaces between a first organic compound layer 1605 and a second organic compound layer 1606 and between the second organic compound layer 1606 and a third organic compound layer 1607 thus formed are clearly separated.

Now, a region 1608 near an interface between the first organic compound layer 1605 and the second organic compound layer 1606 is shown in FIG. 17B. From this drawing, it is apparent that impurities 1610 are mixed into an interface 1609 between the first organic compound layer 1605 and the second organic compound layer 1606. In other words, in the case of a conventional deposition apparatus shown in FIG. 16, the respective layers are formed in separate deposition chambers. Therefore, when the substrate is moved between the deposition chambers, the impurities 1610 are adhered onto the surface of the substrate and thus mixed into the interface 1609. Note that the impurities as described here specifically refer to oxygen, water, and the like.

However, being a junction between substances of different kinds (in particular, a junction between insulating materials), the laminated structure described above will necessarily produce an energy barrier at an interface the substances. Since the presence of an energy barrier inhibits movements of a carrier at the interface, the two following problems are caused.

One of the problems is that it results in a barrier leading to further reduction of drive voltage. Actually, it has been reported with respect to existing organic luminescent elements that an element of a single-layered structure making use of a conjugate polymer is excellent in terms of drive voltage and holds top data (comparison in luminescence from the singlet excited state) in power efficiency (unit:"lm/W") (Literature 4: Tetsuo Tsutsui "bulletin of organic molecular/bioelectronics" subcommittee of Society of Applied Physics, Vol. 11, No. 1, P. 8 (2000)).

In addition, the conjugate polymer described in Literature 4 is a bipolar material, and can attain a level equivalent to that of the laminated structure with respect to the recombination efficiency of a carrier. Accordingly, it demonstrates that a single layer structure having less interfaces is actually low in drive voltage provided that a method making use of a bipolar material can make an equivalent recombination efficiency of a carrier without the use of any laminated structure.

For example, there is a method, in which a material for mitigating an energy barrier is inserted at an interface between an electrode and an organic compound layer to enhance a carrier filling quality to reduce drive voltage (Literature 5: Takeo Wakimoto, Yoshinori Fukuda, Kenichi Nagayama, Akira Yokoi, Hitoshi Nakada, and Masami Tsuchida, "Organic EL Cells Using Alkaline Metal Compounds as Electron Injection Materials", IEE TRANSACTIONS ON ELECTRON DEVICES, VOL. 44, NO. 8, 1245-1248 (1977)). In Literature 5, the use of $Li_2O$ as an electron injecting layer has been successful in reduction of drive voltage.

However, the carrier transfer between organic materials (e.g., between the hole transport layer and luminescent layer; the interface will hereinafter be called "organic interface") remains as an unsettled issue and is considered to be an important point in catching up with the low drive voltage provided by the single-layered structure.

Further, the other problem caused by an energy barrier is believed to be an influence on the service life of organic luminescent elements. That is, movements of a carrier are impeded, and brilliance is lowered due to build-up of charges.

While any definite theory has not been established with respect to such mechanism of deterioration, there is a report that lowering of brilliance can be suppressed by inserting a hole injecting layer between an anode and a hole transporting layer and employing not DC driving but AC driving of rectangular wave (Literature 6: S. A. VanSlyke, C. H. Chen, and C. W. Tang, "Organic electroluminescent devices with improved stability", Applied Physics Letters, Vol. 69, No. 15, 2160-2162 (1996)). This can be said to present an experimental evidence that lowering of brilliance can be suppressed by eliminating accumulation of charges due to insertion of a hole injecting layer and AC driving.

It can be said from the above that on one hand the laminated structure has an advantage in enabling easily enhancing the recombination efficiency of a carrier and enlarging a range of material selection in terms of function separation and on the other hand formation of many organic interfaces impedes movements of a carrier and has an influence on lowering of drive voltage and brilliance.

Meanwhile, in the conventional deposition apparatus, when layers are formed with a hole transport material, luminescent layer material and electron transport material by vacuum deposition, evaporation sources are provided in separate chambers and different layers are formed in the different chambers in order not to contaminate the respective materials. However, such apparatus is encountered with problems that organic interfaces are clearly separated and when a substrate is driven to move between chambers, impurities such as water and oxygen can be mixed into the organic interface, in the case of forming the above-noted multilayer structure.

Besides that, where forming an organic compound layer using the conventional deposition apparatus by deposition method, a compact film is difficult in forming particularly when forming a film of a plurality of organic compounds different in molecular size. However, film compactness is extremely important in improving element characteristics in respect of the following points. First, because carriers recombine while moving around between organic compound molecules, the intermolecular distance of organic compound has an effect upon carrier movement. The increase in intermolecular distance possibly raises a cause of preventing carrier mobility. Furthermore, the low-mobility carrier is placed in a situation to be ready trapped in the gap between organic compounds with the result that a number of carriers not to recombine exist within the organic compound layer.

Namely, it can be considered that, film compactness also has an effect upon decrease in luminance and drive voltage in the luminescent element as noted above.

SUMMARY OF THE INVENTION

Therefore, the present invention provides a deposition apparatus for manufacturing a element which is improved in carrier mobility by moderating the energy barrier existing in an organic compound layer by a concept different from that on the conventionally used laminated structure, and at the same time has the functions of various kinds of materials similarly to function separation in the laminated structure and the films thereof more compact. Also, it is an object to provide a method for depositing a film using such a deposition apparatus.

Regarding the energy barrier relaxation in multilayer structures, it is remarkably seen in the technique for insertion of a carrier injection layer as found in the Literature 5. In other words, at the interface of a multilayer structure having a large energy barrier, insertion of a material for relaxing such energy barrier makes it possible to design the energy barrier into the form of a stair step-like shape.

With such an arrangement, it is possible to increase the injectability of electrical carriers from an electrode and to reduce a drive voltage to a certain degree. However, a problem faced with this approach is that an increase in requisite number of layers would result in an increase in organic interface number. As suggested from Document 4, this is considered to be a cause for the fact that single-layer structures are superior to multilayer structures in holding of the top-class data as to the drive voltage and power efficiency.

Adversely, overcoming this point makes it possible to catch up the drive voltage/power efficiency of single-layer structure while at the same time maintaining the merits of multilayer structures (enabling combination of a variety of materials while avoiding the need for any complicated molecular design).

Consequently, when forming an organic compound layer 104 having a plurality of function regions between an anode 102 and a cathode 103 of a luminescent element as shown in FIG. 1A, between a first function region 105 and a second function region 106 is formed a structure of a first mixed region 108 comprising both of a material structuring the first function region 105 and a material structuring the second function region 106.

Furthermore, between the second function region 106 and a third function region 107 is formed a structure of a second mixed region 109 comprising both of a material structuring the second function region 106 and a material structuring the third function region 107.

It can be considered that, by applying a structure as shown in FIG. 1A, the energy barrier existing between the function regions is moderated to improve carrier injectability. This accordingly can prevent against drive voltage reduction and luminance lowering.

From the foregoing, with deposition apparatus of the present invention, in the manufacture of a luminescent element which at least includes a region (first function region) which a first organic compound can express function and a region (second function region) which a second organic compound different from the substance consisting the first function region can express function and also of a luminescent device having the luminescent element, a feature unique thereto is that a mixed region comprised of the organic compound constituting the first function region and organic compound constituting the second function region is fabricated between the first function region and the second function region.

Meanwhile, as shown in FIG. 1A, the first mixed region 108 to be formed between the first function region 105 and the second function region 106, because continuously formed within a same deposition chamber as shown in FIG. 1B, can prevent impurities from mixing in as shown in FIG. 16B.

It should be noted that the first organic compound and the second organic compound are different in nature from each other while each having its nature as selected from the group consisting of hole injectability for receipt of holes from the anode hole transportability with hole mobility greater than electron mobility, electron transportability with electron mobility greater than hole mobility, electron injectability for receipt of electrons from the cathode, blocking ability for enabling preclusion of movement of either holes or electrons, and luminescent ability exhibiting luminescence. Also note that the organic compound with high hole injectability is preferably made of phthalocyanine-based compound; the organic compound with high hole transportability may be aromatic diamine compound; and, the organic compound with high electron transportability may be a metal complex that contains therein quinoline skeleton, metal complex containing benzoquinoline skeleton or oxadiazole derivative or triazole derivative or phenanthroline derivative. Furthermore, the organic compound exhibiting luminescence may preferably be a metal complex containing therein quinoline skeleton with stabilized light emission, metal complex containing benzooxazole skeleton, or metal complex containing benzothiazole skeleton.

Some combinations of the above-stated first function region and the second function region are shown in Table 1 presented below. Combinations A to E may be employable solely (e.g. only "A") or alternatively some of them are introduced together in a composite fashion (e.g. both "A" and "B").

TABLE 1

| Combination | First Function Region | Second Function Region |
|---|---|---|
| A | Hole Injectability | Hole Transportability |
| B | Electron Injectability | Electron Transportability |
| C | Hole Transportability | Luminescent ability |
| D | Electron Transportability | Luminescent ability |
| E | Electron Transportability | Blocking Ability |

Additionally in the case of introduction with composite use of the combinations C and D (that is, when introducing a mixed region at the both interfaces of a function region with luminescent ability), by preventing diffusion of molecular excitons formed in the luminescent region, it is possible to further increase the luminescent efficiency. Thus it will be preferable that the excitation energy of such luminescent region is lower than the excitation energy of the hole region and the excitation energy of electron transport region. In this case, since luminescent material poor in carrier transportability is also utilizable as the luminescent region, there is an advantage that the range of selecting material expands accordingly. Note here that the term "excitation energy" used in this specification is to be understood to mean an energy difference between the highest occupied molecular orbital (HOMO) and the lowest unoccupied molecular orbital (LUMO).

More preferably, it is designed so that the luminescent region is comprised of both host material and luminescent material (dopant) low in excitation energy than the host material and designed such that the excitation energy of such dopant is lower than the excitation energy of hole transport region and the excitation energy of electron transport layer. With such an arrangement, it is possible to permit the dopant to produce light efficiently while at the same time preventing diffusion of the dopant's molecular excitons. In addition, if the dopant is made of certain material of the carrier trap type then it is also possible to increase the recombination efficiency of carriers.

Furthermore, the deposition apparatus of the invention can form a luminescent element structured as shown in FIG. 1C. In FIG. 1C, in an organic compound layer 104 to be formed between an anode 102 and a cathode 103 on a substrate 101, between a first function region 110 formed of a first organic compound and a second function region 111 formed of a second organic compound is formed a structure having a first mixed region 112 comprising the both of a material comprising the first function region 110 and a material comprising the second function region 111. Furthermore, by doping a third organic compound to the entire or part of the first mixed region, a third function region 113 can be formed in the entire or part of the first mixed region. Note that the third function region 113 formed herein is a region to exhibit light emission.

Incidentally, when forming a element structure of FIG. 1C, the first organic compound and the second organic compound are formed of an organic compound having a nature selected from the group consisting of hole injectability, hole transportability. electron transportability, electron injectability and blocking ability, wherein the respective organic compounds possesses a different property from each other. Furthermore, the third organic compound is a luminescent organic compound (dopant) and requires to use a material lower in excitation energy than the first organic compound and the second organic compound. Note that, in the third function region 113, the first organic compound and the second organic compound play a role as a host to the dopant.

Hereupon, in view of the luminescent efficiency, organic luminescent elements capable of converting energy (referred below to as "triplet excited energy"), which is discharged when returned to a base state from a triplet excited state, into luminance, have been successively presented, and notice has been taken of their luminous efficiency (Literature 7: D. F. O'Brien, M. A. Baldo, M. E. Thompson and S. R. Forrest, "Improved energy transfer in electrophosphorescent devices", Applied Physics Letters, Vol. 74, No. 3, 442-444 (1999)), (Literature 8: Tetsuo TSUTSUI, Moon-Jae YANG, Masayuki YAHIRO, Kenji NAKAMURA, Teruichi WATANABE, Taishi TSUJI, Yoshinori FUKUDA, Takeo WAKIMOTO and Satoshi MIYAGUCHI, "High Quantum Efficiency in Organic Luminescent devices with Iridium-Complex as a Triplet Emissive Center", Japanese Journal of Applied Physics, Vol. 38, L1502-L1504 (1999)).

A metal complex, of which central metal is platinum, is used in Literature 7, and a metal complex, of which central metal is iridium, is used in Literature 8. These organic luminescent elements capable of converting triplet excited energy into luminance (referred below to as "triplet luminescent diode") can attain higher intensity luminance and higher luminous efficiency than in the related art.

However, Literature 8 has presented an example, in which half-life of luminance is about 170 hours in the case where the initial luminance is set to 500 $cd/m^2$, thus causing a problem in service life of an element. Hereupon, application of the invention to triplet light emitting diodes can provide a highly functional luminescent element, which is long in service life in addition to high intensity luminance and high luminous efficiency based on luminance from a triplet excited state.

Consequently, a material capable of converting triplet excited energy into emission light is added as a dopant to the first mixed region 112 to form a third function region 113 in the luminescent element shown in FIG. 1C. Meanwhile, in forming a mixed region, concentration gradient may be provided in the mixed region.

Furthermore, the invention is characterized to make a deposited layer compact by depositing an organic compound layer using vacuum evaporation while irradiating light from a light source as shown in FIGS. 2A to 2C.

FIG. 2A shows a manner of forming, in a deposition chamber 201, an organic compound layer on a substrate formed with up to an anode for a luminescent element. In the deposition chamber 201 has an evaporation source 202 prepared with an organic compound. Incidentally, in the evaporation source 202, the organic compound is vaporized by resistance heating, wherein the organic compound evaporated from the evaporation source 202 in a state of organic compound molecules 203 is deposited on the substrate by vacuum evaporation.

Meanwhile, in the deposition chamber, a light source 204 is provided to continuously irradiate light to the organic compound molecules 203 and the substrate surface during depositing an organic compound onto the substrate. Meanwhile, a ultraviolet ray is radiated from the light source 204. Note that, in the invention, it is preferred to use a wavelength of 100-300 nm of light.

Incidentally, the light from the light source 204 is irradiated to the vaporized organic compound molecules 203 to give photon energy to them. This activates the organic compound molecules 203 to have an effect upon the surface reaction on the substrate surface thus promoting for compact film formation.

Incidentally, the light irradiation in the invention is made not only to the organic compound molecules 203 prior to deposition on the substrate in order to activate the same but also onto the substrate. As shown in FIG. 2B, activation can be also made for the organic compound molecules already deposited on an anode of the substrate. Shown in FIG. 2B is a figure of the substrate being deposited as viewed from the oblique below.

The organic compound molecules on the substrate activated herein gain activation energy due to light irradiation and becomes movable again to a further stable position.

In this manner, because not only the organic compound molecules prior to deposition are allowed to deposit into a more compact film but also the already deposited organic compound molecules are made further compact, it is possible to form an organic compound layer 205 with greater compactness than that obtained so far, as shown in FIG. 2C.

Accordingly, the invention not only places within the same deposition chamber to deposit a plurality of organic compounds and form a plurality of function regions but also forms a mixed region in the interface thereof while irradiating light during deposition as shown in FIGS. 3A and 3B.

In FIG. 3A, in a deposition chamber 301 is provided a substrate formed with an anode for luminescent element. At first, a first organic compound 303a is deposited from a first evaporation source 302a onto the anode, to form a first function region 306. At this time, light irradiation is made from the light source 304 both to the organic compound molecules prior to deposition and to the organic compound molecules already deposited on the substrate (first organic compound molecules 305a, second organic compound molecules 305b). This enhances molecular activation energy to shorten intermolecular distance. Thus, made compact is the organic compound layer forming the first function region 306.

Next, the first organic compound 303a and a second organic compound 303b are simultaneously deposited by vacuum evaporation respectively from the first evaporation source 302a and a second evaporation source 302b, to form a first mixed region 308. At this time, because the deposition is made while irradiating light from the light source similarly, an organic compound layer is formed with further compactness.

Finally, the second organic compound 303b is deposited by vacuum evaporation from the second evaporation source 302b to form a second function region 307 similarly compacted by light irradiation.

By the above, formed is an organic compound layer 309 having the first mixed region 308 between the first function region 306 and the second function region 307 as shown in FIG. 3B, wherein it is possible to extremely shorten the intermolecular distance of the organic compound molecules forming them. If increased is the intermolecular distance of the organic compound constituting the organic compound layer 309, a gap occurs between molecules. The gap between molecules possibly forms a defect in the organic compound layer, to prevent the carrier from moving at the defective site. Due to this, the accumulation of charges causes lowering in luminance and deterioration of the element. From the above, it is effective to provide a light source 304 in the deposition chamber to irradiate light during deposition as in the invention.

As in the above, the deposition apparatus of the invention is characterized in that, in the same deposition chamber having a plurality of evaporation sources, not only formed is a luminescent element having a plurality of function regions and a mixed region as in the foregoing but also these regions are formed with compactness.

In accordance with another aspect of the present invention, the method for manufacturing electroluminescense element comprising a step of forming a organic compound layer in the state of irradiating a light. Thereby, the organic compound layer formed is made compact.

BRIEF DESCRIPTION OF THE DRAWINGS

FIGS. 1A through 1C are views for explaining a element structure to be fabricated by a deposition apparatus of the present invention;

FIGS. 5A and 5B are views for explaining the deposition apparatus;

FIGS. 9A through 9C are views for explaining a material exchange chamber and sealing chamber;

DETAILED DESCRIPTION OF THE PREFERRED EMBODIMENT

Figure 4A:
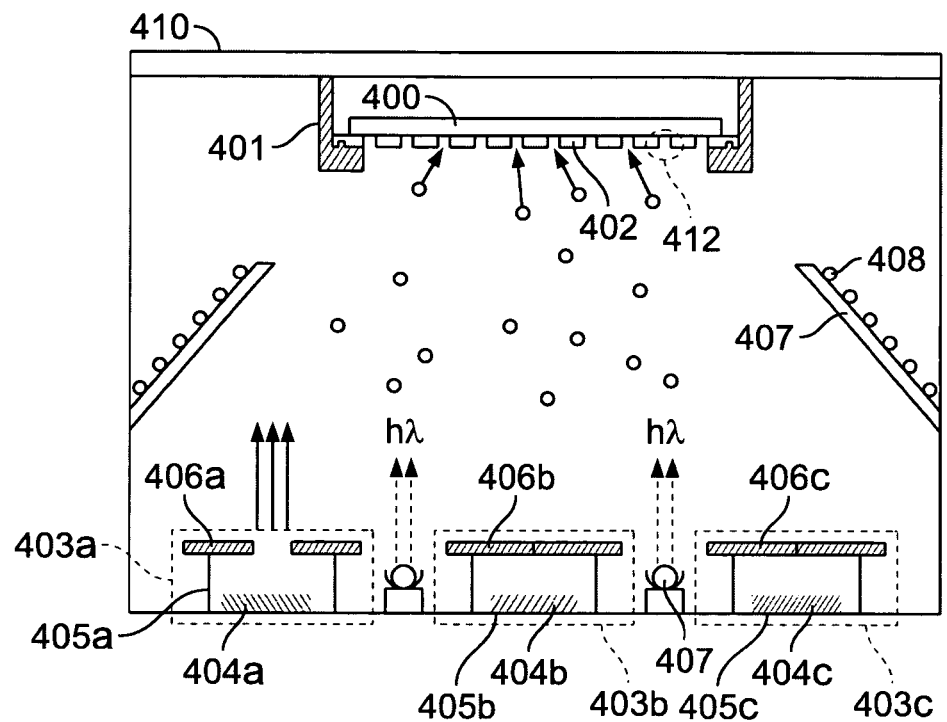
FIGS. 4A and 4B are views for explaining a deposition chamber.

An explanation will now be given of a deposition chamber 410 as used in the deposition apparatus of this invention with reference to FIG. 4A. As shown in FIG. 4A, a metal mask 402 being fixed to a holder 401 is furnished beneath a substrate 400, with an evaporation source 403a to 403c being provided further beneath it. Evaporation sources 403 (403a to 403c) comprises material chambers 405 (405a to 405c) for preparing organic compounds 404 (404a to 404c) for fabrication of organic compound layer therein, and shutters 406 (406a to 406c). Note here that in the deposition apparatus of this invention, it is recommendable that either the evaporation source 403 or a substrate to be subjected to vacuum evaporation be movably (rotatably) arranged to ensure that film is fabricated uniformly.

Figure 20:
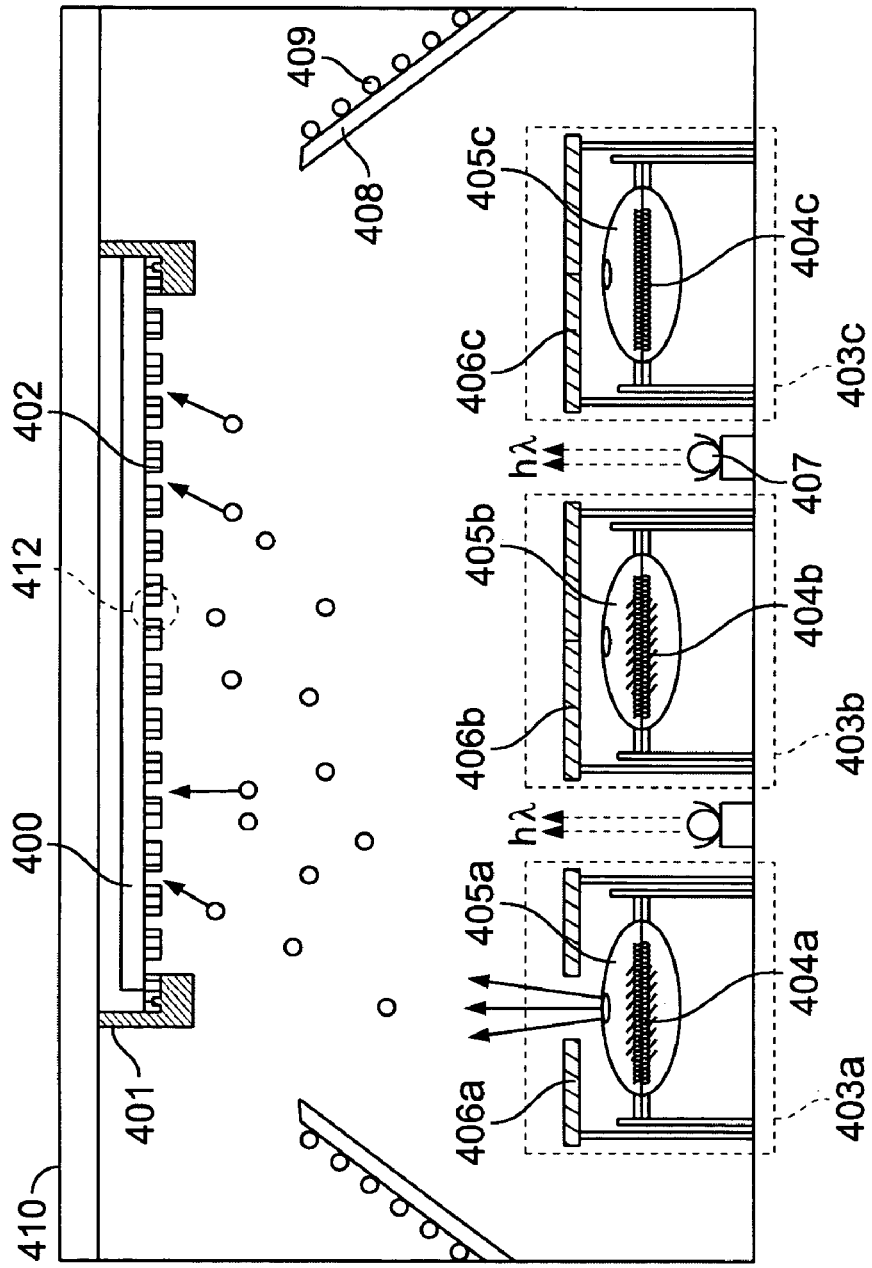
FIG. 20 is a view for explaining material chambers.

Note that the material chambers 405 (405a to 405c) are made of conductive metal material and specifically have a structure shown in FIG. 20. Organic compounds 404 (404a to 404c) will be vaporized and then deposited onto a surface of the substrate 400 upon heat up of the internal organic compounds 404 (404a to 404c) due to resistance occurring when a voltage is applied to the material chambers 405 (405a to 405c). Also note that the term surface of the substrate 400 is to be understood to involve the substrate and more than one thin-film as formed over this substrate, here, an anode is formed on the substrate 400.

In addition the shutters 406 (406a to 406c) control vacuum evaporation of the vaporized organic compounds 404 (404a to 404c). In brief, when the shutters are opened, it is possible to deposit the vaporized organic compounds 404 (404a to 404c) due to heat application by vacuum evaporation. Accordingly, in the description, opening the shutter into a state to deposit an organic compound is referred to as operating the evaporation source.

Additionally it will be desirable that the organic compounds 404 (404a to 404c) be pre-vaporizable by heat application prior to the vacuum evaporation process for enabling effectuation of any vacuum evaporation immediately after the shutters 406 (406a to 406c) are opened during vacuum evaporation, thus shortening a time period required for deposition.

Meanwhile, the deposition apparatus of the invention is arranged to form an organic compound layer having a plurality of function regions within one deposition chamber, having the evaporation sources 403a to 403c provided in plurality in accordance therewith. Note that, in the invention, a plurality of organic compounds are simultaneously deposited by simultaneously operating the plurality of evaporation sources. Also, a plurality of organic compounds can be continuously deposited by continuously operating the plurality of evaporation sources. In this case, it is possible to prevent against interfacial contamination of between different regions because gas to be escaped can be prevented from intruding due to pressure change within the deposition chamber. Namely, it is possible to deposit by vacuum evaporation from the evaporation sources in plurality continuously without interruption in time. Incidentally, by operating the evaporation source the organic compound is vaporized to evaporate upward and deposited onto the substrate 400 through an opening 412 provided in the metal mask 402.

Meanwhile, light sources 407 are provided between the evaporation sources 403 (403a to 403c) to irradiate light to the organic compound molecules and substrate during deposition. The irradiation of light can provide activation energy to the organic compound molecules evaporating from the evaporation source and in a state immediately before arriving the substrate and to the organic compound molecules already deposited on the substrate, thus making possible to form a further compact organic compound layer.

Incidentally, the invention radiates an ultraviolet ray from the light source 407. For example, it is possible to use a low-pressure mercury lamp having a wavelength of 184.9 nm or 253.7 nm, an inert gas resonance line (Kr: 123.6 nm, 116.5 nm, Xe: 147.0 nm, 129.5 nm) or other low-pressure metal vapor lamps (Cd: 326.1 nm, 228.8 nm, Zn: 307.6 nm, 213.9 nm). However, it is particularly preferred to radiate an ultraviolet ray having a wavelength of from 100 to 300 nm. Explanation is made below on a further concrete film deposition method.

Initially a first organic compound 404a furnished in the first material chamber 405a is subject to vacuum evaporation. Note here that the first organic compound 404a is vaporized in advance by resistive heat up and thus dispersed in the direction of substrate 400 upon opening of the shutter 406a during vacuum evaporation. Whereby, it is possible to form a first function region 105 shown in FIG. 1A.

And, while letting the first organic compound 404a kept deposited, open another shutter 406b for execution of vacuum evaporation of a second organic compound 204b furnished in the second material chamber 405b. Note that the second organic compound also is pre-vaporized by resistive heat up and thus dispersed in the direction of substrate 400 upon opening of the shutter 406b during vacuum evaporation. Here, it is possible to form a first mixed region 108 which consists essentially of the first organic compound 404a and the second organic compound 404b.

And, after a while, close only the shutter 406a for vacuum evaporation of the second organic compound 404b. Thus it is possible to form a second function region 106.

It should be noted that although one specific method for forming the mixed region through simultaneous vacuum evaporation of two kinds of organic compounds is shown here, it is also possible to form the mixed region between the first function region and second function region by depositing the first organic compound and, thereafter, depositing the second organic compound in the vacuum evaporation environment of the first organic compound.

Next, while letting the second organic compound 404b kept deposited, open a shutter 406c for execution of vacuum evaporation of a third organic compound 404c as has been furnished in the third material chamber 405c. Note that the third organic compound 404c is also pre-vaporized by resistive heat up and thus dispersed in the direction of substrate 400 upon opening of the shutter 406c during vacuum evaporation. Here, it is possible to form the second mixed region 109 which consists essentially of the second organic compound 404b and the third organic compound 404c.

After a short time, only the shutter 406b is closed to deposit the third organic compound 404c. This can form the third function region 107. Incidentally, it is assumed in the invention that light is always kept irradiated from the light source 407 during depositing an organic compound layer. Finally, a cathode is formed thereby completing a luminescent element of the invention.

Figure 1C:
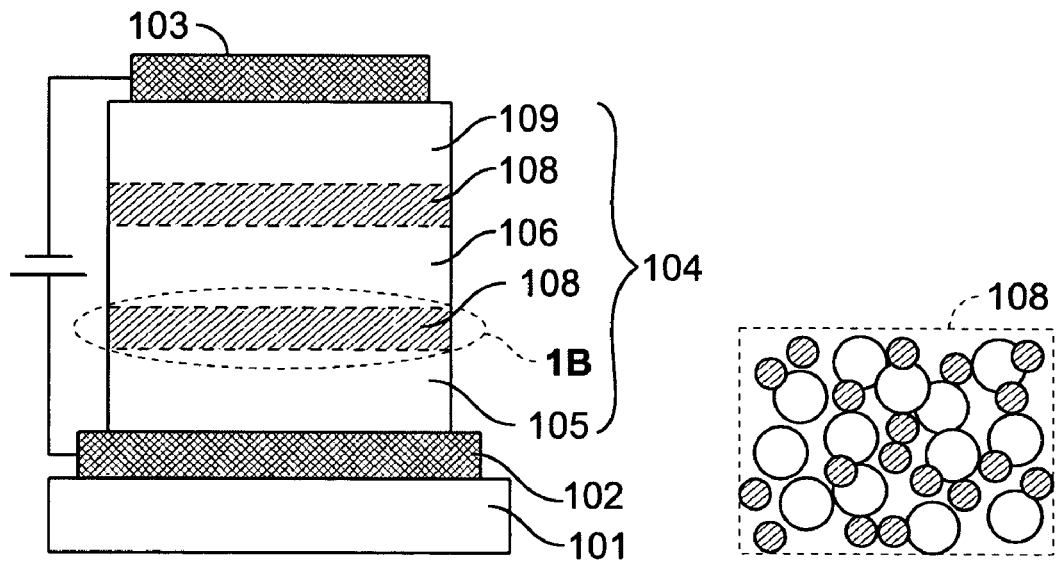
Figure 1C:
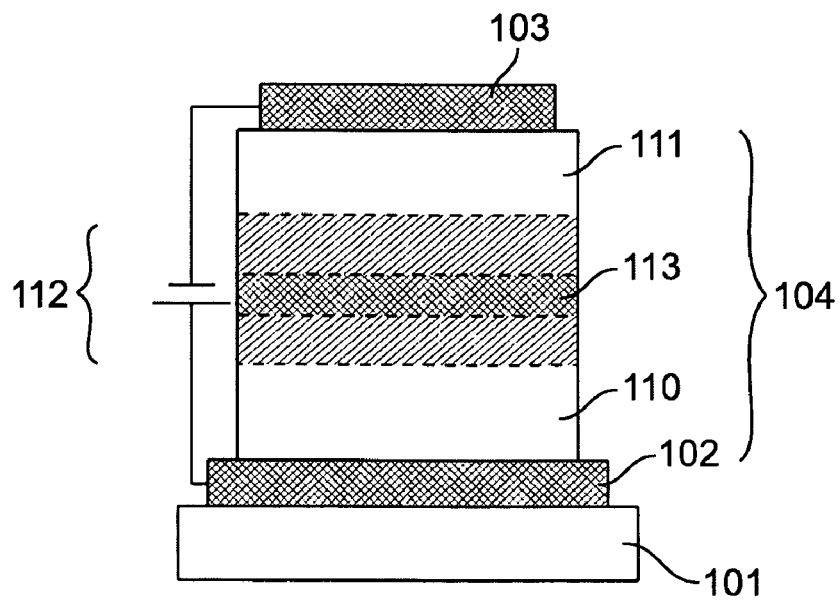

Incidentally, in a luminescent element shown in FIG. 1C, a first function region 110 is formed using the first organic compound 404a. Thereafter, formed is a first mixed region 112 of the first organic compound 404a and the second organic compound 404b. In the course of forming the first mixture region 112, the shutter 406c is temporarily (or simultaneously) opened to perform deposition (doping) of the third organic compound 404 thereby forming a third function region 113.

Next, a first mixed region 112 is again formed by closing the shutter 406c. Meanwhile, where doping the third organic compound in the first mixed region 112 entirety, the shutter 406c is opened simultaneously with opening of the shutter 406b and is closed simultaneously with closing of the shutter 406a.

Furthermore, a second function region 111 is formed of the second organic compound 404b. By the above, the organic compound layer 104 is formed. In also this case, it is assumed to continue the irradiation of light from the light source during forming an organic compound layer. By forming a cathode in a separate deposition chamber or by a separate deposition apparatus, a luminescent element is formed.

Figure 4B:
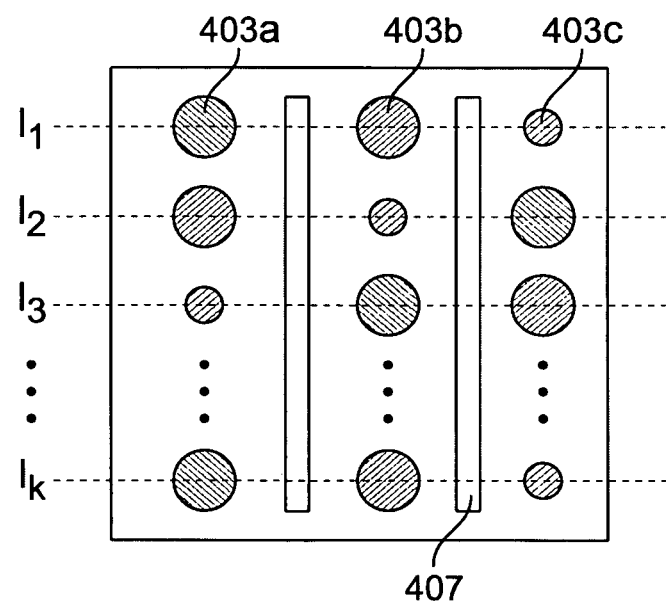

Herein, FIG. 4B shows the evaporation sources 403 and light sources 407 provided in the evaporation chamber. FIG. 4B shows the manner of arrangement of the evaporation sources 403 and light sources 407 provided in the deposition chamber, as viewed from the above of the deposition chamber.

Herein, explanation is made on a case to form an organic compound layer by using three kinds of organic compounds as shown in FIG. 1A. The evaporation sources 403a, 403b, 403c respectively prepared with three kinds of organic compounds are arranged in a horizontal line. These lines are provided k (k=1 to 10 lines) in the number in a vertical direction. In this manner, by providing a plurality of evaporation sources having the same organic compound within the same deposition chamber, it is possible to make even the film thickness of an organic compound layer formed on the substrate. Meanwhile, the light sources 407 are provided between these evaporation sources (403a to 403c). Incidentally, although herein shown is the case that the arrangement of the three kinds of organic compounds are different between adjacent lines (1), such arrangement is not necessarily required, i.e. arrangement may be with the lines having the placement in the same order. Concerning the light sources 407, such arrangement is not necessarily required, i.e. arrangement may be to irradiate light to the organic compound molecules evaporated within the deposition chamber or to the organic compound molecules on the substrate, as even as possible.

It must be noted that in view of the fact that with the deposition apparatus of this invention the deposition is performed by use of the plurality of material chambers within the same deposition chamber, a material chamber with the organic material used for deposition may be designed to move at an optimal location beneath the substrate during deposition process in order to improve the deposition property or, alternatively, the substrate is modified to have a function of moving at an optimal position overlying the material chamber for the same purpose.

Furthermore, the deposition chamber of this invention is provided with an attachment-preventing shield 408 for preventing attachment of organic compounds to the inner wall of such deposition chamber during vacuum evaporation. Providing this attachment-preventing shield 408 makes it possible to deposit those organic compound components that have failed to be deposited on the substrate. Around the attachment-preventing shield 408, a heating wire 409 is provided in contact therewith, wherein the use of this heating wire 409 enables the entirety of such attachment-preventing shield 408 to be heated. Additionally, heating the attachment-preventing shield 408 makes it possible to vaporize the organic compounds attached to the shield 408. This in turn makes it possible to achieve successful cleaning of the interior of deposition chamber.

As the deposition apparatus of the invention capable of fabricating the above-discussed organic compound layers enables formation of an organic compound layer having a plurality of function regions within the same deposition chamber, it is possible to form a mixed region at the interface between function regions without letting the function region interface be contaminated by impurities. From the foregoing, it is apparent that a luminescent element comprising multiple functions is manufacturable without showing any distinct multilayer structures (that is, without associating any distinct organic interfaces).

Furthermore, explanation is made on a structure of a deposition apparatus having a deposition chamber so far explained, using FIGS. 5A and 5B. FIG. 5A is a diagram showing an upper plan view of the deposition apparatus, and FIG. 5B shows a cross-sectional view thereof. Note here that common components will be designated by common reference numerals. Also there is shown an example which is arranged so that three kinds of organic compound layers (red, green, blue) are formed in each deposition chamber of a deposition apparatus of the inline scheme having three deposition chambers.

In FIG. 5A, reference numeral 500 is a load chamber. Substrates prepared in the load chamber are transported to a first alignment chamber 501. Incidentally, in the first alignment chamber 501, a metal mask 503 previously fixed on a holder 502 is aligned with the holder. A substrate 504 prior to deposition is placed on the metal mask 503 completed in alignment. This makes the substrate 504 and the metal mask 503 in one body to be transported to a first deposition chamber 505.

Herein, explanation is made on a positional relationship of the holder 502 for fixing the metal mask 503 and the substrate 504, using FIGS. 6A through 6E. Note that the same ones as those of FIGS. 5A and 5B use the same reference numerals.

Figure 6A:
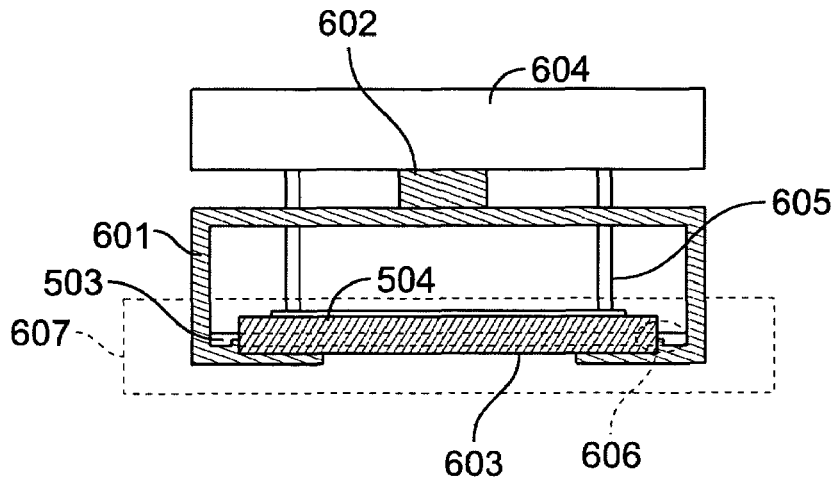
FIGS. 6A through 6E are views for explaining a method for aligning a metal mask.

A sectional structure is shown in FIG. 6A. The holder 502 shown herein is generally constituted from a mask holder 601, a shaft 602, a substrate holder 603, control mechanism 604 and auxiliary pins 605. Additionally the metal mask 503 is fixed in a way aligned with a projection 606 on the mask holder 601, with the substrate 504 mounted on the metal mask 503. Additionally the substrate 504 on the metal mask 503 is fixed by the auxiliary pins 605.

Figure 6B:
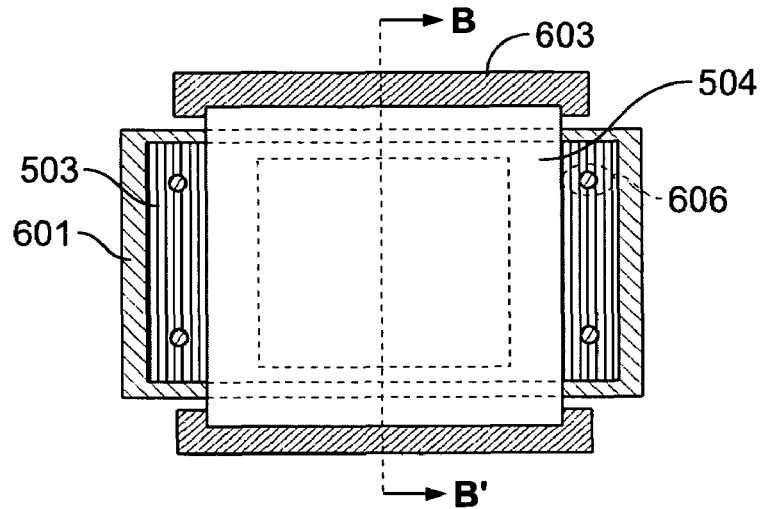

An upper plan view in a region 607 of FIG. 6A is shown in FIG. 6B. Additionally the substrate 304 is fixed by the substrate holder 603 shown in FIG. 6A and FIG. 6B.

Figure 6C:
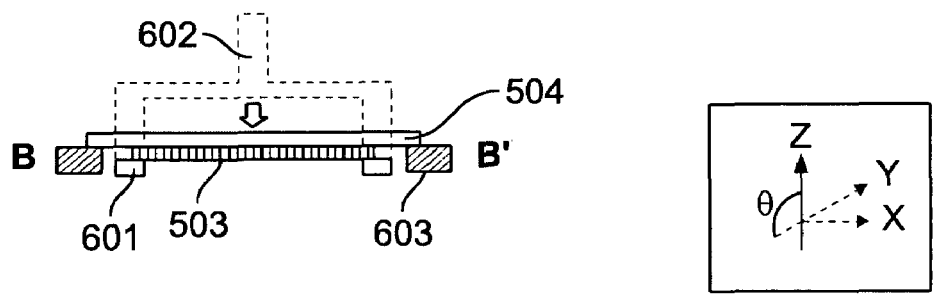

Further, a sectional view as taken along line B-B' of FIG. 6B is shown in FIG. 6C. Assuming that the position of the metal mask 503 shown in FIG. 6C is at the time of deposition, a position of the metal mask 503 shown in FIG. 6D with the shaft 602 moved in Z-axis direction is during alignment process.

Figure 6D:
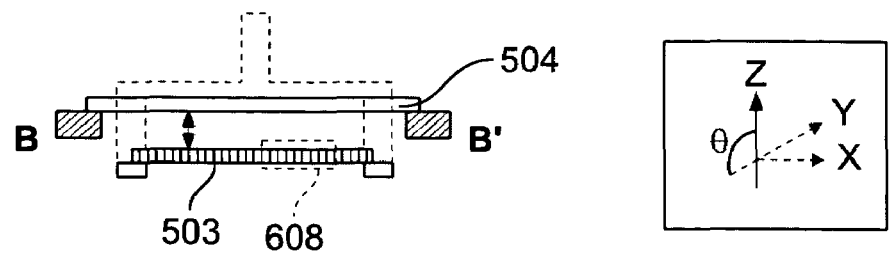

At the process step of FIG. 6D, the shaft 602 is movable in any one of X-axis and Y-axis, and Z-axis directions, further, movement of gradient (θ) of an X-Y plane with respect to the Z-axis is also possible. Additionally, the control mechanism 604 outputs a movement information from both a position information obtained from a charge-coupled device (CCD) camera and a position information input therein in advance, thereby the position of the mask holder can be identical with a specified position through the shaft 602 coupled to the control mechanism 604.

Figure 6E:
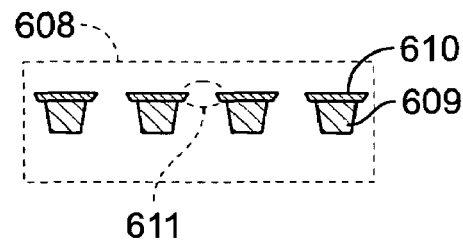

In addition, an enlarged view of the metal mask 503 in a region 608 is shown in FIG. 6E. The metal mask 503 as used herein is structured from a mask a609 and a mask b610 formed using different materials each other. Additionally during vacuum evaporation, organic compounds that have passed through these openings 611 will be fabricated on the substrate. Their shapes are contrived to improve the deposition accuracy upon execution of vacuum evaporation using the masks and in use, the mask b610 is on the side close to the substrate 504.

When alignment of the metal mask 503 is completed, let the shaft move in the Z-axis direction causing the metal mask 503 to again move at the position of FIG. 6C and then let the metal mask 503 and substrate 504 be fixed together by the auxiliary pins 605, thus making it possible to complete the alignment of the metal mask 503 along with the positioning between the metal mask 503 and the substrate 504. Incidentally, in this embodiment, the opening of the metal mask 503 may be square, rectangular, circular or elliptic. These may be in a matrix arrangement or in a delta arrangement. Otherwise, they may be in a linear arrangement.

The first deposition chamber 505 in FIG. 5A is provided with a plurality of evaporation sources 506. Additionally each the evaporation sources 506 consists of a material chamber (not shown) in which organic compounds are prepared and a shutter (not shown) for controlling through open/close operations dispersion of vaporized organic compound in the material chamber toward outside of the material chamber.

In addition, the plurality of evaporation sources 506 provided in the first deposition chamber 505 are provided with organic compounds having different functions for constituting an organic compound layer of a luminescent element, respectively. Note here that the organic compounds as used herein may refer to organic compounds having its nature of hole injectability for receipt of holes from the anode, hole transportability with hole mobility greater than electron mobility, electron transportability with electron mobility greater than hole mobility, electron injectability for receipt of electrons from the cathode, blocking ability for enabling inhibition of movement of either holes or electrons, and luminescent ability exhibiting light emission.

Note here that the organic compound with a high hole injectability may preferably be phthalocyanine-based compound; the organic compound with a high hole transportability is preferably aromatic diamine compound; and, the organic compound with a high electron transportability is preferably a metal complex containing benzoquinoline skeleton, oxadiazole derivative, triazole derivative, or still alternatively phenanthroline derivative. Further, the organic compound exhibiting luminescent ability is preferably a metal complex containing quinoline skeleton, metal complex containing benzooxazole skeleton, or metal complex containing benzothiazole skeleton, which emit a steady light.

Meanwhile, a plurality of light sources 513 are provided in the first deposition chamber 505. Incidentally, during deposition, light is irradiated from the light source 513.

In the first deposition chamber 505, the organic compounds provided in these evaporation sources are deposited by a vacuum evaporation in order, using the method discussed in FIG. 4A, resulting in formation of a first organic compound layer (here, red) having a plurality of function regions and mixed regions.

Next, the substrate 504 is transported toward a second alignment chamber 507. In the second alignment chamber 507, after once substrate 504 is separated from the metal mask 503, alignment of the metal mask 303 is done in such a manner that it matches a position whereat a second organic compound layer is to be fabricated. And, after completion of the alignment, the substrate 504 and the metal mask 503 are overlapped with each other and fixed together.

Then, the substrate 504 is transported to a second deposition chamber 508. The second deposition chamber 508 is similarly provided with a plurality of evaporation sources. By the deposition using a plurality of organic compounds in order similarly to that of the first deposition chamber 505, formed is a second organic compound layer comprising regions having a plurality of functions (green, herein). Incidentally, a plurality of light sources are provided also in the second deposition chamber 508 so that, during deposition, light is irradiated from the light source.

Further, transfer the substrate 504 toward a third alignment chamber 509. In the third alignment chamber 509, after once the substrate 504 is separated from the metal mask 503, alignment of the metal mask 503 is done in such a way that it matches a position whereat a third organic compound layer is to be fabricated. And, after completion of the alignment, the substrate 504 and metal mask 503 are overlapped with each other and fixed together.

Then, the substrate 504 is transported to a third deposition chamber 510. The third deposition chamber 510 has similarly a plurality of evaporation sources. By the deposition using a plurality of organic compounds in order similarly to that of the other deposition chamber, formed is a third organic compound layer comprising regions having a plurality of functions (blue, herein). Incidentally, a plurality of light sources are provided also in the third deposition chamber 510 so that, during deposition, light is irradiated from the light source.

Finally, the substrate 504 is transported to an unload chamber 511 where it is taken to the outside.

Performing in this way the alignment of the metal mask 503 in the alignment chamber once at a time whenever a different organic compound layer is formed, a plurality of organic compound layers can be formed within the same apparatus. As function regions consisting of a single organic compound layer is deposited in the same deposition chamber in this way, it is possible to avoid impurity contamination between adjacent function regions. Furthermore in this deposition apparatus, since it is possible to form a mixed region between different function regions, it becomes possible manufacture a luminescent element having multiple functions without indicating any distinct multilayer structures.

Additionally although there is shown in this embodiment a deposition apparatus which operates up to the formation of the organic compound layers, the deposition apparatus of the present invention should not be limited only to this structure and may alternatively be modified to have a structure comprising a deposition chamber in which the cathode is formed on an organic compound layer and a processing chamber capable of sealing the luminescent element. Additionally the deposition order of the organic compound layers which emit red, green and blue light should not be limited to the above-stated one.

Figure 7:
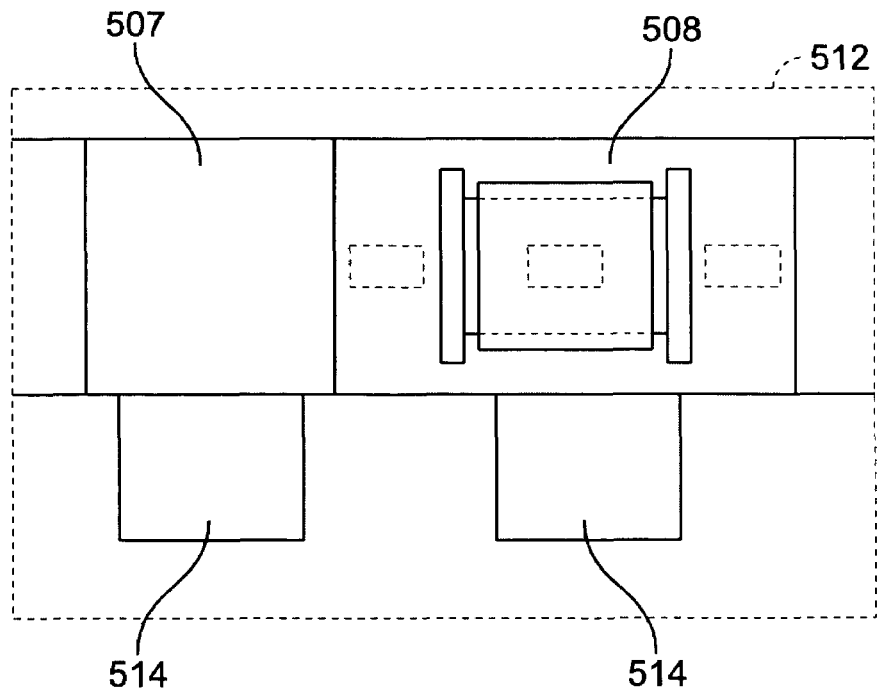
FIG. 7 is a view for explaining a cleaning preparatory chamber.

Moreover, there may also be provided a means for cleaning the alignment and deposition chambers as indicated in this embodiment mode. Also note that in case such means is provided in the region 512 of FIG. 5A, it is possible to provide a cleaning preliminary chamber 514 shown in FIG. 7.

In the cleaning preliminary chamber 514, let radicals generate by decomposition of a reactive gas such as $NF_3$ or $CF_4$ and then introduce them into the second alignment chamber 507 to thereby enable cleaning at the second alignment chamber 507. Note here that the metal mask can be cleanup by providing used metal mask in the second alignment chamber 507 in advance. Also note that introducing the radicals into the second deposition chamber 508 also makes it possible to clean up the inside of the second deposition chamber 508. Additionally the second alignment chamber 507 and second deposition chamber 508 are connected with the cleaning preliminary chamber 514 through gates (not shown) respectively, wherein the gates are designed to open upon introduction of radicals.

Embodiment 1

Figure 8:
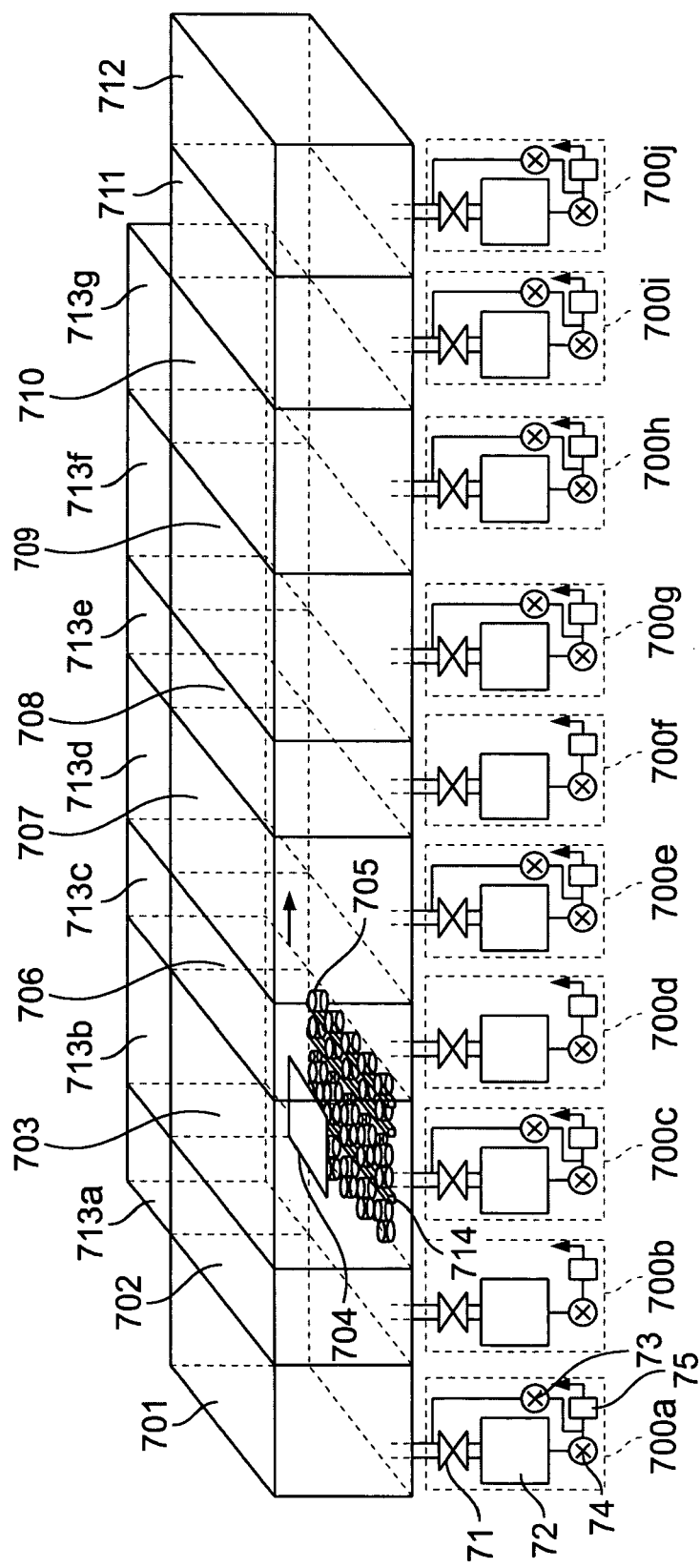
FIG. 8 is a view for explaining the deposition apparatus.

An explanation will be given of the case where the deposition apparatus of the present invention is the inline scheme, with reference to FIG. 8. In FIG. 8, reference numeral 701 denotes a load chamber, from which a substrate is transported. Note that the term substrate as used in this embodiment is to be understood to mean the one with either an anode or cathode (anode used in this embodiment) of a luminescent element being formed thereon. In addition the load chamber 701 comes with a gas exhaust system 700a, wherein this exhaust system 700a is constituted including a first valve 71, a cryopump 72, a second valve 73, a third valve 74 and a dry pump 75.

Meanwhile, because the attainable vacuum degree within the deposition chamber is preferably $10^{-6}$ Pa or less, it is desired to use an vacuum pump having a exhaust rate of 10000 l/s or higher.

Additionally in this embodiment, as the material used for inside of respective processing chambers such as a gate-blocked load chamber, an alignment chamber, a deposition chamber, a sealing chamber and an unloading chamber, a material such as aluminum or stainless steel (SUS) with mirror surfaces through treatment of electro polishing is used on the internal wall planes thereof due to its capability to reduce an adsorption of the impurity such as oxygen and water by making surface area of the inside wall smaller. Incidentally, these materials have a surface smoothness providing an average surface roughness of 5 nm or smaller (preferably 3 nm or smaller). Note that the average surface roughness herein refers to the three-dimensional extension in order to apply the centerline average roughness defined in JIS B0601 to a surface.

Besides the above, there is a method to use a material readily reactable with a gas to form an active surface on the interior wall of the deposition chamber. The material, in this case, desirably uses Ti, Zr, Nb, Ta, Cr, Mo, W, La, Ba or the like.

Although the first valve 71 is a main valve having a gate valve, a butterfly valve that functions also as a conductance valve will alternatively be used. The second valve 73 and the third valve 74 are fore valves. First, a pressure of the load chamber 701 is roughly reduced by the dry pump 75 with the second valve 73 opened, next, a pressure of the load chamber 701 is reduced to a high degree of vacuum by the cryopump 72 with the first valve 71 and the third valve 74 open. Note that cryopump may be replaced with a mechanical booster pump and a turbo molecular pump, alternatively, the cryopump is usable after increased the vacuum degree by the mechanical booster pump.

Next, the one indicated by numeral 702 is an alignment chamber. Here, alignment of a metal mask and positioning of a substrate on the metal mask are done for deposition at a deposition chamber to which it will next be transferred. This will be called alignment chamber A702. Additionally, the method explained in FIGS. 6A through 6E may be employed in the alignment method here. Additionally the alignment chamber A702 comprises a gas exhaust system 700b and is shut and shielded from the load chamber 701 by a gate, not shown.

Further, the alignment chamber A702 is provided with a cleaning preliminary chamber 713a for producing therein radicals by decomposition of a reactive gas such as $NF_3$ or $CF_4$ or else and then introducing this into the alignment chamber A702, to thereby enable of cleanup at the alignment chamber A702. Note that the used metal mask can be cleanup by providing the metal mask in the alignment chamber A702 in advance.

Next, numeral 703 denotes a deposition chamber for fabrication of a first organic compound layer by vacuum evaporation methods, which will be called deposition chamber A703 hereinafter. The deposition chamber A703 comprises an exhaust system 700c. In addition, this is shut and shielded from the alignment chamber A702 by a gate. not shown.

In a similar way to the alignment chamber A702, the deposition chamber A703 is provided with a cleaning preliminary chamber 713b. Note here that the interior of the deposition chamber A703 can be cleanup by introducing into the deposition chamber A703 radicals produced through decomposition of a reactive gas such as $NF_3$, or $CF_4$ or else.

In this embodiment, a deposition chamber that has the structure shown in FIG. 4A is provided as the deposition chamber A703 for fabrication of the first organic compound layer which emits red light. Additionally provided as the evaporation sources are a first evaporation source provided with an organic compound with hole injectability, a second evaporation source provided with an organic compound with hole transportability, a third evaporation source provided with an organic compound with hole transportability for use as a host of organic compound with luminescent ability, a fourth evaporation source provided with an organic compound with luminescent ability, a fifth evaporation source provided with an organic compound with blocking ability, and a sixth evaporation source provided with an organic compound with electron transportability. Meanwhile, a plurality of light sources 714 are provided in the deposition chamber A703, to irradiate light from the light sources 714 during deposition.

Incidentally, the light source can use a low-pressure mercury lamp with a wavelength of 184.9 nm or 253.7 nm, an inert gas resonance line (Kr: 123.6 nm, 116.5 nm, Xe: 147.0 nm, 129.5 nm) or other low-pressure metal vapor lamps (Cd: 326.1 nm, 228.8 nm, Zn: 307.6 nm, 213.9 nm). However, this embodiment uses, as the light source 714, a low-pressure mercury lamp to irradiate light having a wavelength of 184.9 nm.

It is also noted that in this embodiment, copper phthalocyanine (abbreviated as Cu- Pc hereinafter) is used as the organic compound with hole injectability that provided in the first evaporation source; 4,4'-bis [N-(1-naphthyl)-N-phenyl-amino]-biphenyl (abbreviated as α-NPD hereafter) is used as the organic compound with hole transportability being provided in the second evaporation source; 4,4'-dicarbazole-biphenyl (CBP) is used as the organic compound which becomes the host provided in the third evaporation source; 2, 3, 7, 8, 12, 13, 17, 18-octaethyl-21H, 23H-porphyrin-platinum (PtOEP) is used as the organic compound with luminescent ability provided in the fourth evaporation source; bathocuproin (BCP) is used as the organic compound with blocking ability provided in the fifth evaporation source; and, tris (8-quinolinolat) aluminum ($Alq_3$) is used as the organic compound with electron transportability provided in the sixth evaporation source.

It is noted that the organic compound layer comprising regions having the functions of hole injectability, hole transportability, luminescent ability, and electron transportability can be formed over the anode by depositing these organic compound in order through a vacuum evaporation.

Meanwhile, in the present embodiment a mixed region is formed at the interfaces between different function regions by simultaneously depositing the organic compounds for forming the both function regions. Namely, mixed regions are formed respectively at an interface between a hole injection region and a hole transport region, at an interface between the hole transport region and a hole transport region including a luminescent region, at an interface between the hole transport region including the luminescent region and a blocking region and at an interface of the blocking region and an electron transport region.

Practically, after formed a first function region through deposition of Cu-Pc to a thickness of 15 nm, both Cu-Pc and α-NPD are deposited by a vacuum evaporation at a same time to thereby form a first mixed region with a film thickness of 5 to 10 nm. Then, fabricate a film of α-NPD to a thickness of 40 nm to thereby form a second function region, followed by formation of a second mixed region with a thickness of 5 to 10 nm by simultaneous vacuum evaporation of α-NPD and CBP. Thereafter, fabricate a film of CBP to a thickness of 25 to 40 nm, thus forming a third function region. However, by simultaneously depositing CBP and PtOEP for the entire or a constant period to form a third function region, a third mixed region is formed in the entirety or in part of the third function region. Note here that the third mixed region has luminescent ability. Further, both CBP and BCP are deposited by simultaneous vacuum evaporation to a film thickness of 5 to 10 nm, thereby forming a fourth mixed region. Thereafter, a BCP film is fabricated to a thickness of 8 nm, thus forming a fourth function region. Furthermore, BCP and $Alq_3$ are deposited by simultaneous vacuum evaporation to a film thickness of 5 to 10 nm, resulting in formation of a fifth mixed region. Lastly a film of $Alq_3$ is formed to a thickness of 25 nm, thus enabling formation of a fifth function region. With the above process steps, a first organic compound layer is thus formed.

It should be noted that in the above explanation concerning the first organic compound layer six kinds of organic compounds different in function from one another are provided in six evaporation sources respectively and the organic compound layer is then formed by vacuum evaporation of these organic compounds. The present invention should not be limited only to the above and may use a plurality of organic compounds. Additionally the organic compound provided in a single evaporation source should not always be limited to a single one and may alternatively be multiple ones. For example, in addition to a single kind of material provided in an evaporation source as an organic compound with luminescent ability, another organic compound that serve as a dopant may be provided together. Note that the first organic compound layer has a plurality of functions and prior known materials may be used as these organic compounds composing an organic compound layer which emits the red light.

It is to be noted that the evaporation sources may be designed so that a microcomputer is used to control the deposition speeds thereof. Additionally, with this arrangement, it is preferable to control the ratio of mixture upon simultaneous fabrication of a plurality of organic compound layers.

Next, the one indicated by numeral 706 is an alignment chamber. Here, alignment of a metal mask and positioning of a substrate on the metal mask are done for deposition at a deposition chamber to which it will next be transferred. This will be called an alignment chamber B706. Additionally, the method explained in FIGS. 6A through 6E may be employed in the alignment method here. Additionally the alignment chamber B706 comprises a gas exhaust system 700d and is shut and shielded from the deposition chamber A703 by a gate not shown. It further comprises a cleaning preliminary chamber 713c that is shut and shielded from the alignment chamber B706 by a gate not shown, in a similar way to the alignment chamber A702.

Next, numeral 707 denotes a deposition chamber for fabrication of a second organic compound layer by vacuum evaporation, which will be called the deposition chamber B707. This deposition chamber B707 is provided with an exhaust system 700e. In addition it is shut and shielded from the alignment chamber B706 by a gate, not shown. Further, it comprises a cleaning preliminary chamber 713d which is shut and shielded from the deposition chamber B707 by a gate not shown, in a similar way to the deposition chamber A703.

Figure 2A:
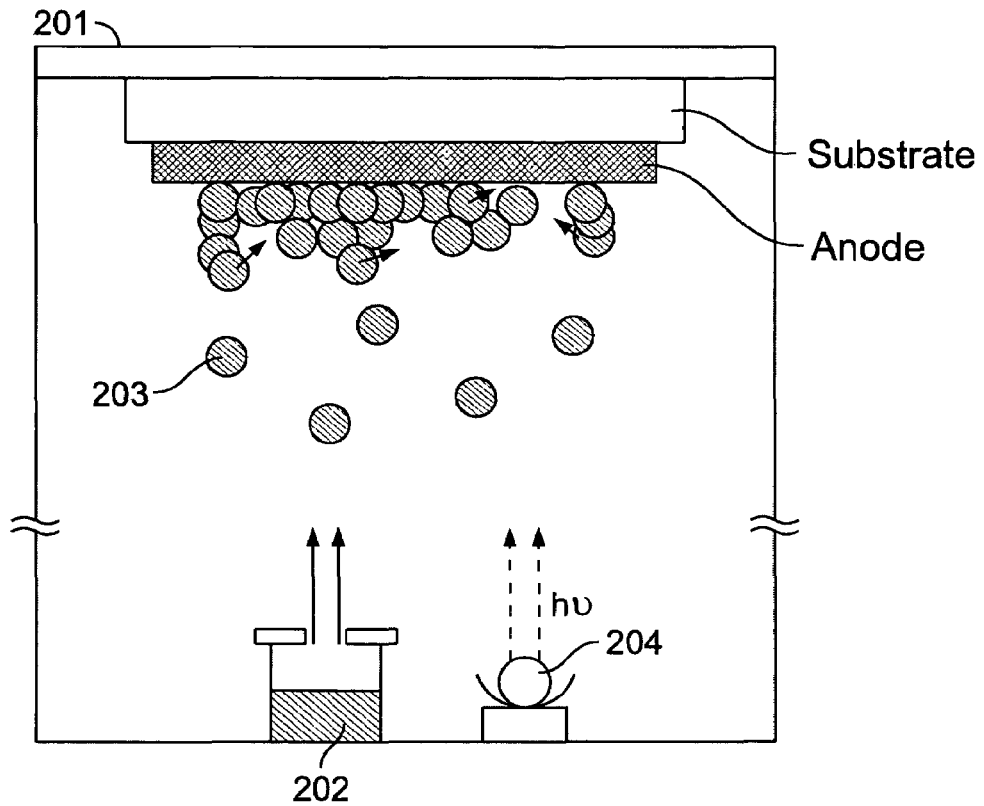
FIGS. 2A through 2C are views for explaining a behavior of organic compound due to light irradiation.
Figure 2B:
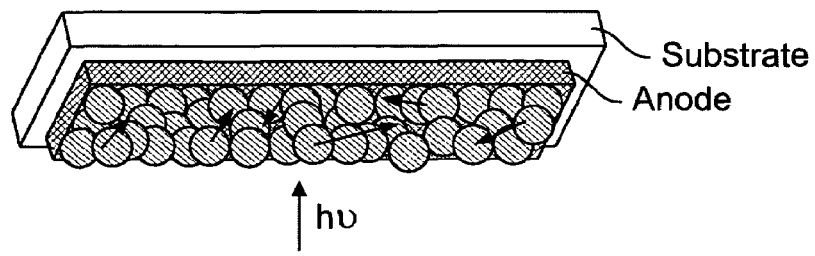
Figure 2C:
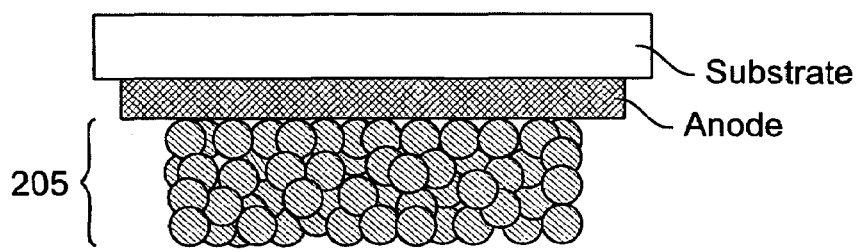
Figure 3A:
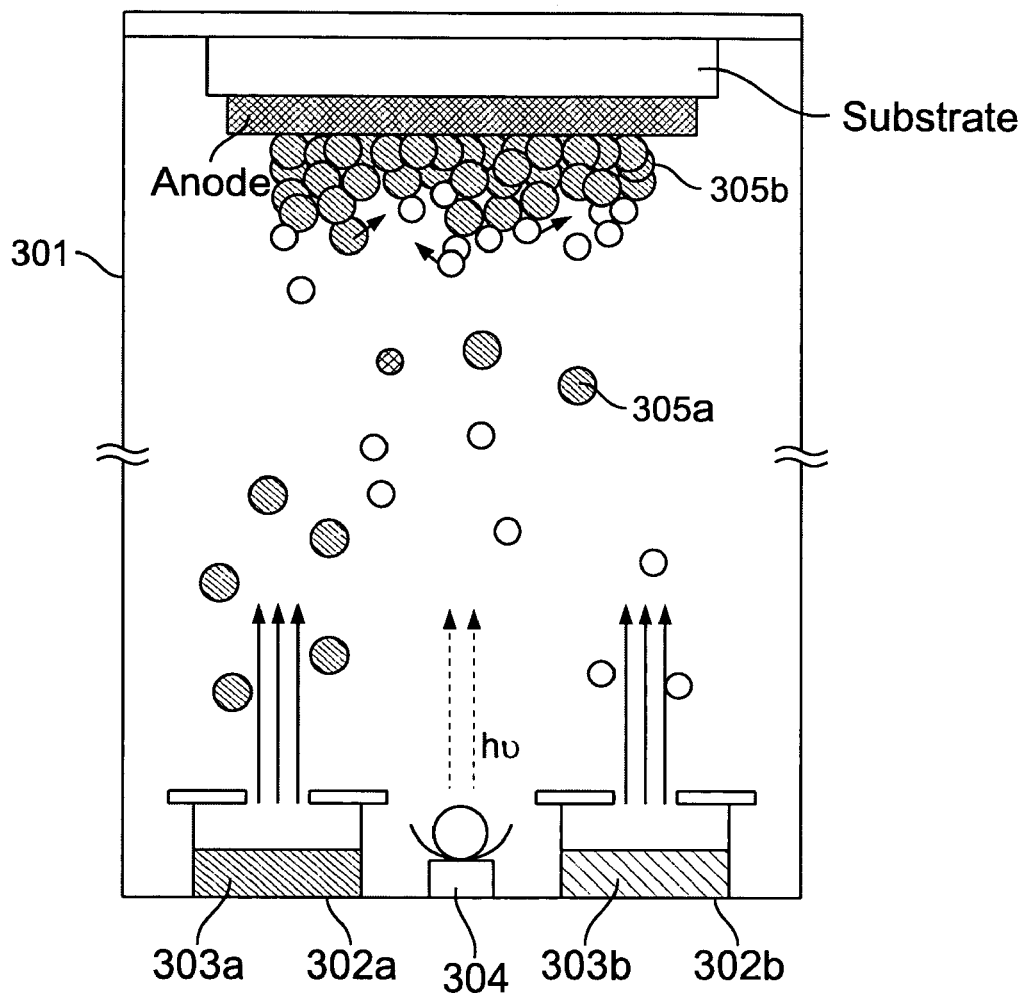
FIGS. 3A and 3B are views for explaining the fabrication of a element by a deposition apparatus of the invention.
Figure 3B:
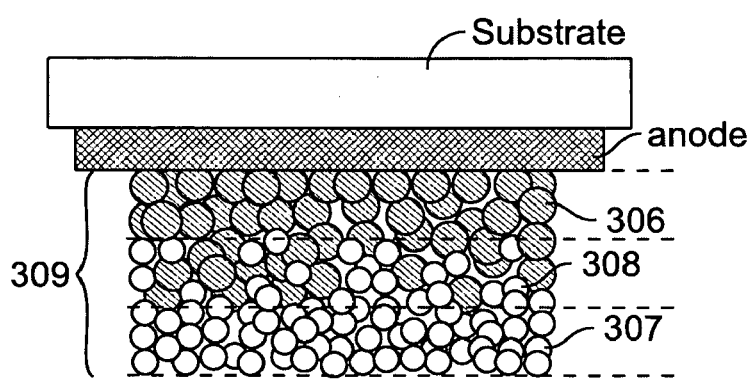

In this embodiment a deposition chamber with the structure shown in FIG. 2A is provided as the deposition chamber B507 for fabrication of a second organic compound layer which emits green light. Additionally provided as the evaporation sources are a first evaporation source provided with an organic compound with hole injectability, a second evaporation source and a third evaporation source each provided with organic compounds with hole transportability, a fourth evaporation source provided with a host material with hole transportability, a fifth evaporation source provided with an organic compound with luminescent ability, a sixth evaporation source provided with an organic compound with blocking ability, and a seventh evaporation source provided with an organic compound with electron transportability. Meanwhile, a plurality of light sources 714 are provided in the deposition chamber A703, to irradiate light from the light sources 714 during deposition. Incidentally, a low-pressure mercury lamp as a light source is provided also in the deposition chamber B707, to irradiate light having a wavelength of 184.9 nm.

Meanwhile, it is noted that in this embodiment, Cu-Pc is employed as the organic compound with hole injectability provided in the first evaporation source; 4,4',4"-tris(3-methylphenylphenylamino)triphenyl (hereinafter, designated MTDATA) is employed as the organic compound with hole transportability provided in the second evaporation source; α-NPD is employed as the organic compound with hole transportability provided in the third evaporation source; CBP is employed as the host material with hole transportability provided in the fourth evaporation source; tris(2-phenylpyridine) iridium ($Ir(ppy)_3$) is employed as the organic compound with luminescent ability provided in the fifth evaporation source; BCP is employed as the organic compound with blocking ability provided in the sixth evaporation source; and, $Alq_3$ is employed as the organic compound with electron transportability provided in the seventh evaporation source.

Incidentally, by depositing these organic compounds in the order, on an anode can be formed a second organic compound layer comprising the regions having the functions of hole injectability, hole transportability, luminescent ability, blocking ability and electron transportability.

Meanwhile, in this embodiment mixed regions are formed at the interface between different function regions by simultaneously depositing the organic compounds for forming the both function regions. Namely, mixed regions are respectively formed at an interface between a hole injection region and a hole transport region, an interface between the hole transport region and a hole transport region including a luminescent region, an interface between the hole transport region including the luminescent region and a blocking region and an interface of the blocking region and an electron transport region.

Practically, after formed a first function region through deposition of Cu-Pc to a thickness of 10 nm, both Cu-Pc and MTDATA are deposited by a vacuum evaporation at a same time to thereby form a first mixed region with a film thickness of 5 to 10 nm. Then, fabricate a film of MTDATA to a thickness of 20 nm to thereby form a second function region, followed by formation of a second mixed region with a thickness of 5 to 10 nm by simultaneous vacuum evaporation of MTDATA and α-NPD. Thereafter fabricate a film of α-NPD to a thickness of 10 nm, thereby forming a third function region. Then, by simultaneous vacuum evaporation of α-NPD and CBP, a third mixed region is formed in thickness from 5 to 10 nm. Subsequently, fabricate a film of CBP to a thickness of 20 to 40 nm to thereby form a fourth function region. For the entire period or a constant period to form the fourth function region, CBP and ($Ir(ppy)_3$) are simultaneously deposited by vacuum evaporation thereby forming a fourth mixed region in the entire or part of the fourth function region. The fourth mixed region is formed in a film thickness of 5 to 40 nm. Note that the fourth mixed region herein possesses luminescent property. Next, deposit a BCP film of 10 nm thickness to thereby form a fifth function region. Thereafter, simultaneously deposit BCP and $Alq_3$ by vacuum evaporation to form a sixth mixed region with a film thickness of 5 to 10 nm; lastly, form a film of $Alq_3$ to a thickness of 40 nm, thus forming a sixth function region to thereby form a second organic compound layer.

Noted that in the above explanation the organic compound layer is formed by vacuum evaporation from seven evaporation sources provided with organic compounds having different functions respectively as the second organic compound layer. The present invention should not be limited only to the above and is modifiable as far as a plurality of evaporation sources. Additionally prior known materials may be used as organic compounds with a plurality of functions for forming an organic compound layer which emits green light.

Incidentally, the evaporation sources are desirably controlled in deposition rate by a microcomputer. Meanwhile, due to this, mixing ratio is desirably controlled in simultaneously depositing a plurality of organic compounds.

Next, the one indicated by numeral 708 is an alignment chamber. Here, alignment of a metal mask and positioning of a substrate on the metal mask are done for deposition at a deposition chamber to which it will next be transferred. This will be called an alignment chamber C708. Additionally, the method explained in FIGS. 6A through 6E may be employed in the alignment method here. Additionally the alignment chamber C708 comprises a gas exhaust system 700$f$ and is shut and shielded from the deposition chamber B707 by a gate not shown. It further comprises a cleaning preliminary chamber 713$e$ that is shut and shielded from the alignment chamber C708 by a gate not shown, in a similar way to the alignment chamber A702.

Next, numeral 709 denotes a deposition chamber for fabrication of a second organic compound layer by vacuum evaporation, which will be called the deposition chamber C709. This deposition chamber C709 is provided with an exhaust system 700$g$. In addition it is shut and shielded from the alignment chamber C708 by a gate not shown. Further, it comprises a cleaning preliminary chamber 713$f$ which is shut and shielded from the deposition chamber C709 by a gate not shown, in a similar way to the deposition chamber A703.

In this embodiment a deposition chamber with the structure shown in FIG. 4A is provided as the deposition chamber C709 for fabrication of a third organic compound layer which emits blue light. Additionally provided as the evaporation sources are a first evaporation source provided with an organic compound with hole injectability, a second evaporation source provided with organic compound with luminescent ability, a third evaporation source provided with blocking ability, a fourth evaporation source provided with an organic compound with electron transportability. It is noted that in this embodiment, Cu-Pc is employed as the organic compound with hole injectability provided in the first evaporation source; α-NPD is employed as the organic compound with luminescent ability provided in the second evaporation source; BCP is employed as the organic compound with blocking ability provided in the third evaporation source; and, $Alq_3$ is employed as the organic compound with electron transportability provided in the fourth evaporation source. Incidentally, a low-pressure mercury lamp is provided as a light source also in the deposition chamber C709, to irradiate light having a wavelength of 184.9 nm.

Meanwhile, this embodiment uses Cu-Pc as a hole injection organic compound to be prepared in the first evaporation source, α-NPD as a luminescent organic compound to be prepared in the second evaporation source, BCP as a blocking organic compound to be prepared in the third evaporation source and $Alq_3$ as an electron transport organic compound to be prepared in the fourth evaporation source.

Incidentally, by depositing these organic compounds in the order, on an anode can be formed the third organic compound layer comprising the regions having the functions of hole injectability, luminescent ability, blocking ability and electron transportability.

Meanwhile, this embodiment forms mixture regions at the interface of different function regions by simultaneously depositing the organic compounds for forming the both function regions. Namely, mixture regions are respectively formed at an interface of hole-injecting region and light-emitting region, an interface of light-emitting region and blocking region and an interface of blocking region and electron-transporting region.

Practically, after formed a first function region through deposition of Cu-Pc to a thickness of 20 nm, both Cu-Pc and α-NPD are deposited by a vacuum evaporation at a same time to thereby form a first mixed region with a film thickness of 5 to 10 nm. Then, fabricate a film of α-NPD to a thickness of 40 nm to thereby form a second function region, followed by formation of a second mixed region with a thickness of 5 to 10 nm by simultaneous vacuum evaporation of α-NPD and BCP. Thereafter fabricate a film of BCP to a thickness of 10 nm, thereby forming a third function region. Then, by simultaneous vacuum evaporation of BCP and $Alq_3$, a third mixed region is formed in thickness from 5 to 10 nm; lastly, form a film of $Alq_3$ to a thickness of 40 nm, to thereby form a fourth function region. By the above, a third organic compound layer is formed.

Noted that in the above explanation the organic compound layer is formed by successive vacuum evaporation from fourth evaporation sources provided with four organic compounds having different functions respectively as the third organic compound layer. The present invention should not be limited only to the above and is modifiable as far as a plurality of evaporation sources. Also, an organic compound provided in a single evaporation source is not limited to have one kind, may be a plurality of ones. For instance, in addition to a single kind of material provided in an evaporation source as the organic compound with luminescent ability, another organic compound that serve as a dopant may be provided together. Note that prior known materials may be used as organic compounds with a plurality of functions for forming an organic compound layer which emits blue light.

Incidentally, the evaporation sources are desirably controlled in deposition rate by a microcomputer. Meanwhile, due to this, mixing ratio is desirably controlled in simultaneously depositing a plurality of organic compounds.

Additionally in this embodiment, one specific case has been explained where the organic compound layer which emits red light is formed in the first deposition chamber A703 while forming the organic compound layer which emits green light in the second deposition chamber B707 and also forming the organic compound layer which emits blue light in the third deposition chamber C709. However, the order of formation of these layers should not be limited only the above order. One of the organic compound layers which emit lights of red, green, and blue, respectively may be formed within one of the deposition chamber A703, deposition chamber B707, and deposition chamber C709. Still alternatively, an additional deposition chamber may be provided for forming an organic compound layer which emits white light therein.

Next, numeral 710 denotes a deposition chamber for formation of a conductive film being either the anode or the cathode of a luminescent element (a metal film used as the cathode in this embodiment) by vacuum evaporation, which will be called the deposition chamber D710. The deposition chamber D710 comprises an exhaust system 700h, in addition, is shut and shielded from the deposition chamber C709 by a gate not shown. Further, it comprises a cleaning preliminary chamber 713g which is sealed and shielded from the deposition chamber D710 by a gate not shown, in a similar manner to that of the deposition chamber A703.

In this embodiment, in the deposition chamber D710, an Al—Li alloy film (film made of an alloy of aluminum and lithium) is deposited by vacuum evaporation as the conductive film used as the cathode of the luminescent element. Additionally it will also possible to employ co-vacuum evaporation of aluminum and an element belonging to either the group I or group II of the periodic table.

Meanwhile, the deposition chamber A703, the deposition chamber B707, the deposition chamber C709 and the deposition chamber D710 are provided with mechanisms to heat up each of the interior of the deposition chambers. This can remove a part of the impurities within the deposition chamber.

Furthermore, although a dry pump, a mechanical booster pump, a turbo molecule pump (magnetic float type) or a cryopump is used as the vacuum pump to be provided in the deposition chamber, in this embodiment both of a cryopump and a dry pump are desirably used.

Meanwhile, the deposition chamber A703, the deposition chamber B707, the deposition chamber C709 and the deposition chamber D710 are pressure-reduced by an vacuum pump. Incidentally, the attainable vacuum degree in this case is desirably $10^{-6}$ Pa or greater. For example, it is desired to form the interior of the deposition chamber by using a material such as aluminum that, using a cryopump having an exhaust rate of 10000 l/s ($H_2O$), the leak rate at 20 hours is $4.1 \times 10^{-7}$ Pa*$m^3$*$s^{-1}$ or less when the deposition chamber interior has a surface area of 10 $m^2$. In order to obtain such a vacuum degree, it is effective to decrease the surface area of the deposition chamber interior by electrolytic polish.

Alternatively a CVD chamber may be provided here for formation of an insulating film such as a silicon nitride film, silicon oxide film and DLC film or else as a protective film (passivation film) of the luminescent element. Note that in the case of providing such CVD chamber, it will be preferable that a gas purifying machine be provided for increasing in advance the purity of a material gases used in the CVD chamber.

Next, 711 is a sealing chamber having an exhaust system 700i. Meanwhile, this chamber is closely shielded from the deposition chamber D710 by a not-shown gate. Incidentally, the sealing chamber 711 is in a vacuum state wherein, when a plurality of substrates that each having a luminescent element and formed up to a cathode are transported into the sealing chamber, the gate is closed to bring the sealing chamber 711 to an atmospheric pressure state by using an inert gas (nitrogen, helium, argon or the like) to finally seal the luminescent element into an enclosed space. Incidentally, the sealing chamber 711 is provided with a transport mechanism (not shown) to transport the substrate from the deposition chamber D710. The sealing process herein is a process to protect the formed luminescent element from oxygen or moisture. Means is used to mechanically seal with a cover member or to seal with thermally hardenable resin or ultraviolet-ray hardenable resin.

Meanwhile, a cover member is previously prepared in the sealing chamber. While the cover material used may be glass, ceramics, plastic or metal, the cover material must have optical transmissivity in cases where light is emitted toward the cover material side. Additionally the cover material and a substrate with the above-stated luminescent element formed thereon are adhered together by use of a sealant such as thermal hardenable resin or ultraviolet-ray hardenable resin or else, thereby forming an air-tight sealed space by letting the resin be hardened through thermal processing or ultraviolet ray irradiation processing. It is also effective to provide in this sealed space a moisture absorbable material, typical example of which is barium oxide. Incidentally, the bonding between the substrate formed with a luminescent element and the cover member are made, after being positioned, by a positioning mechanism connected to a CCD camera. Furthermore, there is also provided a mechanism for automatically processing to apply a sealant and add an absorbent.

It will also be possible to fill the space between the cover material and the substrate having the luminescent element formed thereon with either thermal hardenable resin or ultraviolet-ray hardenable resin. In this case, it is effective to add an absorbent typically such as barium oxide into either the thermal hardenable resin or ultraviolet-ray hardenable resin.

In the deposition apparatus shown in FIG. 8, a mechanism for irradiation of ultraviolet light to the interior of the sealing chamber 711 (referred to as the "ultraviolet light irradiation mechanism" hereinafter) is provided, which is arranged so that ultraviolet light as emitted from this ultraviolet light irradiation mechanism is used to harden the ultraviolet-ray hardenable resin.

Lastly, numeral 712 is an unload chamber, which comprises an exhaust system 700j. The substrate with luminescent element formed thereon will be taken out of here.

Figure 9C:
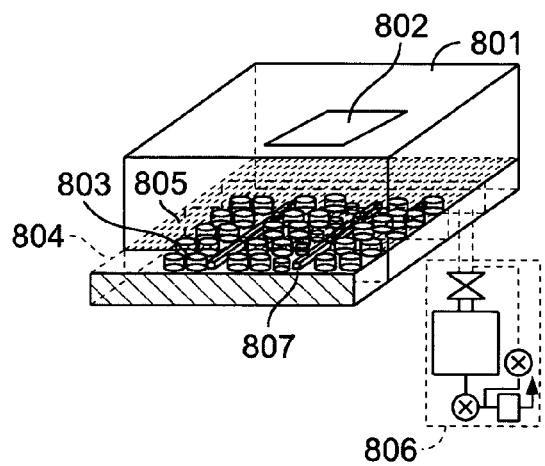
Figure 9C:
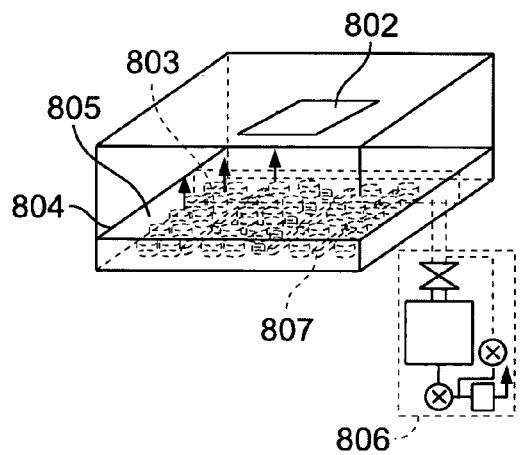
Figure 9C:
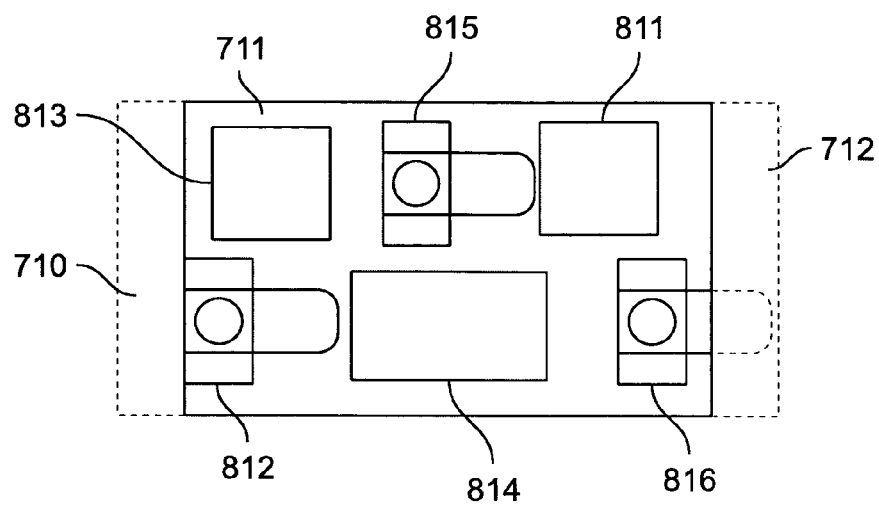

Furthermore, FIGS. 9A and 9B show a case that a mechanism for exchanging the organic compound is provided in the deposition chamber possessed by the deposition apparatus shown in the present embodiment. Furthermore, FIG. 9C shows a detailed structure of the sealing chamber 711.

In FIG. 9A, a substrate 802 is prepared in a deposition chamber 801. The organic compound for forming an organic compound layer on the substrate is prepared in an evaporation source 803. Incidentally, the evaporation source 803 is provided in a material exchange chamber 804 to be separated through a gate 805 from the deposition chamber 801 having a substrate. Accordingly, in this embodiment by closing the gate 805 the material exchange chamber 804 is separated from the deposition chamber 801. After returning the interior of the material exchange chamber 804 in a vacuum state to an atmospheric pressure by the exhaust system 806, this chamber is drawn out as shown in FIG. 9A. This makes it possible to add or exchange the organic compound prepared in the evaporation source of the material exchange chamber 804.

Completing the addition or exchange of the organic compound, the material exchange chamber 804 is moved back to the former position as shown in FIG. 9B. The interior is made in a vacuum state by the exhaust system 806. After reaching the same pressure state as the interior of the deposition chamber, the gate 805 is opened thereby enabling deposition from the evaporation source 803 to the substrate 802.

Incidentally, a heater is provided in the material exchange chamber 804 to heat up an exchanged material. Previously heating up the material can remove impurity such as water. At this time, the temperature to be applied is desirably 200° C. or lower.

Meanwhile, as shown in FIG. 9C, the sealing chamber 711 is provided with a plurality of processing mechanisms. First, a plurality of cover members to be used in sealing are provided in a stock site 811. Meanwhile, the substrate to be seal-processed is transported from the deposition chamber D710 by a transport mechanism A812 and temporarily stored in a storage site 813.

After the substrates in a certain constant quantity are accumulated in the storage site 813, the sealing chamber is made into an enclosed space by a gate and thereafter into an atmospheric pressure state by an inert gas (nitrogen, argon, helium or the like).

After the sealing chamber reaches in an atmospheric pressure state, the substrates are processed one by one. First, the transport mechanism A812 transports the substrate from the storage site 813 to a positioning mechanism 814. At this time, sealant and absorbent are provided on the substrate and a cover member is transported from the stock site 811 to the positioning mechanism 814 by the transport mechanism B815, thereby bonding with the substrate.

Next, ultraviolet light is radiated from the ultraviolet light radiating mechanism (not shown), thereby completing the sealing of the substrate. Completing the sealing of the substrate, the transport mechanism C816 transports it to the unload chamber 712 where it is taken out.

As described above, the use of the deposition apparatus shown in FIG. 8 (or FIGS. 9A through 9C) allows a luminescent element not to be exposed to the ambient air until completely sealed into an enclosed space, enabling the manufacture of a luminescent element high in reliability.

Embodiment 2

Figure 10A:
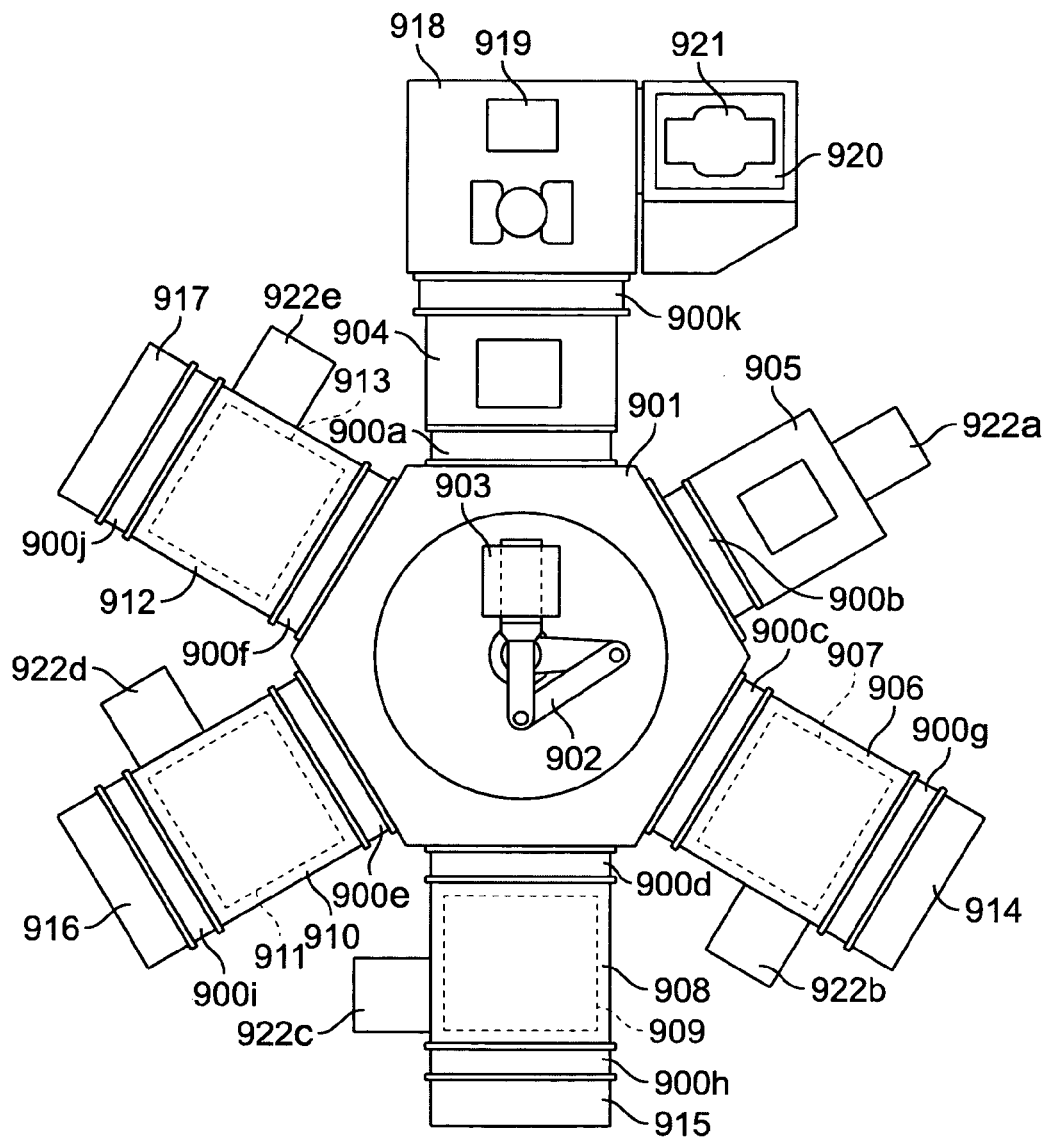
FIGS. 10A and 10B are views for explaining the deposition apparatus.
Figure 10B:
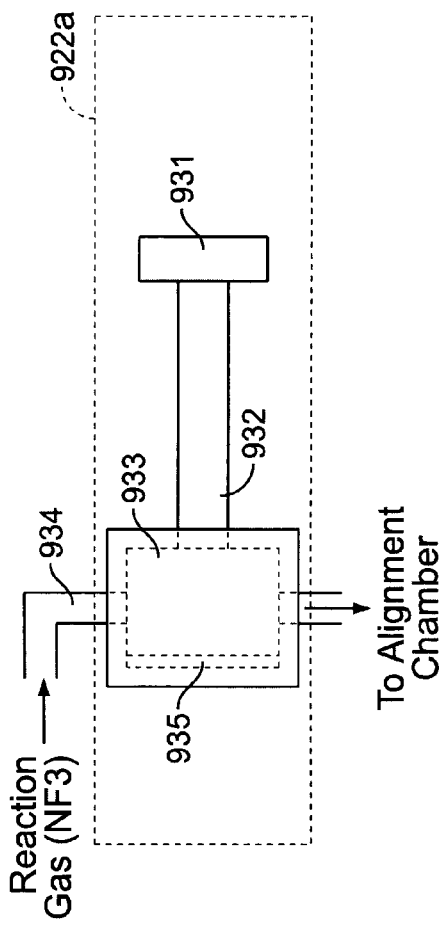

A deposition apparatus of the present invention will be explained with reference to FIGS. 10A and 10B. In FIGS. 10A and 10B, reference numeral 901 denotes a transfer chamber, wherein this transfer chamber 901 comprises a transfer mechanism A902 for performing transport of a substrate 903. The transfer chamber 901 is set in a pressure-reduced atmosphere and is coupled by a gate with each processing chamber. A substrate is transported to each processing chamber by the transfer mechanism A902 upon opening of the gate. Additionally while vacuum pump such as a dry pump, a mechanical booster pump, a turbo molecular pump (magnetic floatation type) or cryopump is employable for pressure reduction of the transfer chamber 901. A cryopump that is excellent in removal of water and the like are desirably used together with a dry pump.

An explanation will be given of each processing chamber below. Note that the transfer chamber 701 is set in a pressure-reduced atmosphere so that all the processing chambers directly coupled to the transfer chamber 701 are provided with vacuum pumps (not shown). While dry pumps, mechanical booster pumps, turbo molecular pumps (magnetic floatation type) or cryopumps are employable as the vacuum pumps, the turbo molecular pumps of the magnetic flotation type are preferable used together with the dry pump in this case also.

First, numeral 704 denotes a load chamber for performing setting (installation) of a substrate. The load chamber 704 is coupled by a gate 700a with the transfer chamber 701, at here a carrier (not shown) with a substrate 703 mounted thereon is arranged. Additionally the load chamber 704 can also do double-duty as a chamber that transfers a substrate which element formation is finished toward the sealing chamber. Additionally the load chamber 704 may alternatively have separated rooms for carry-in of the substrate and for carry-out of the substrate. Note that the load chamber 704 comprises the above described vacuum pomp and a purge line for introduction of a high-purity nitride gas or noble gas. Additionally the vacuum pump used herein is preferably a cryopump. Further, this purge line is provided with a gas refining machine for removal in advance of impurities (oxygen and water) of such gases to be introduced into the apparatus.

First, numeral 904 denotes a load chamber for performing setting (installation) of a substrate. The load chamber 904 is coupled by a gate 900a with the transfer chamber 901, at here a carrier (not shown) with a substrate 903 mounted thereon is arranged. Additionally the load chamber 904 can also do double-duty as a chamber that transfers a substrate which element formation is finished toward the sealing chamber. Additionally the load chamber 904 may alternatively have separated rooms for carry-in of the substrate and for carry-out of the substrate. Note that the load chamber 904 comprises the above described vacuum pomp and a purge line for introduction of a high-purity nitride as or noble gas. Additionally the vacuum pump used herein is preferably a cryopump. Further, this purge line is provided with a gas refining machine for removal in advance of impurities (oxygen and water) of such gases to be introduced into the apparatus.

It is also noted that in this embodiment, a substrate which a transparent conductive film used as the anode of luminescent element is formed thereon is used as the substrate 903. In this embodiment the substrate 903 is set in a carrier with its deposition surface being directed downwardly. This is for performing of face-down scheme (also known as depo-up scheme) when later performing deposition by vacuum evaporation methods. The face-down scheme is to be understood to mean a scheme for performing deposition while letting the deposition surface of a substrate being directed downwardly. With this scheme, it is possible to suppress attachment of contaminant particles such as dusts.

Next, the one indicated by numeral 905 is an alignment chamber for alignment of a metal mask and for matching position between a metal mask and a substrate with either the anode or the cathode of luminescent element (anode in this embodiment) formed thereon, wherein the alignment chamber 905 is coupled by a gate 900b with the transfer chamber 901. Note that a process in combination of the metal mask alignment and positioning of the substrate and metal mask is done within the alignment chamber, once at a time whenever a different organic compound layer is formed. In addition, the alignment chamber 905 comprises a charge-coupled device (CCD) known as an image sensor, thereby making it possible to accurately perform position alignment of the substrate and its associated metal mask in deposition using the metal mask. Note that with respect to metal mask alignment, the method discussed in FIGS. 6A through 6E may be used.

Further, a cleaning preliminary chamber 922a is coupled to the alignment chamber 905. An arrangement of the cleaning preliminary chamber 922a is as shown in FIG. 10B. First, the cleaning preliminary chamber 922a has a μ-wave oscillator 931 for generation of μ waves, wherein μ waves generated at here will be sent through a wave guide tube 932 toward a plasma discharge tube 933. Note that μ waves of about 2.45 GHz are radiated from the μ wave oscillator 931 used here. In addition, a reactive gases are supplied to the plasma discharge tube 933 from a gas inlet tube 934. Additionally here, $NF_3$ is used as the reactive gas, although other gases such as $CF_4$ and $ClF_3$ may be used as reactive gases.

And, the reactive gas is decomposed by μ wave in the plasma discharge tube 933, causing radicals to generate. These radicals are guided to pass through the gas inlet tube 934 to introduce the alignment chamber 905 as coupled via a gate (not shown) thereto. Additionally the plasma discharge tube 933 may be provided with a reflection plate 935 for efficient supplement of μ waves.

And, the alignment chamber 905 comprises a metal mask with an organic compound layer attached thereto. And open a gate (not shown) provided between the cleaning preliminary chamber 922a and the alignment chamber 905, thereby enabling introduction of radicals into the alignment chamber 905. This makes it possible to perform cleaning of the metal mask.

As the use of μ-wave plasma makes it possible to perform radicalization of a reactive gas with high efficiency, the rate of creation of impurities such as side products or the like is low. In addition, since it is different in mechanism from standard radical production, the resultant radicals will no longer be accelerated and radical is not produced within the interior of the deposition chamber. This makes it possible to prevent damages within the deposition chamber due to the presence of a plasma and also damages of the metal mask.

It should be noted that the technique for cleaning the alignment chamber by use of the thus method is one of the preferred modes of the present invention so that this invention should not be limited thereto. Accordingly, it may also be performed a dry cleaning by introducing reactive gases into the deposition chamber to thereby produce a plasma within this deposition chamber, alternatively, a physical cleaning by sputter methods through introduction of an Ar gas or else.

Next, numeral 906 denotes a deposition chamber used for deposition of an organic compound layer by vacuum evaporation method, which will be called the deposition chamber A906 hereinafter. The deposition chamber A906 is coupled via a gate 900c to the transfer chamber 901. In this embodiment a deposition chamber with the structure shown in FIG. 4A is provided as the deposition chamber A906.

In this embodiment, a first organic compound layer for light emission of red color is formed in a deposition portion 907 inside the deposition chamber A906. The deposition chamber A906 includes a plurality of evaporation sources, concretely, a first evaporation source including an organic compound with a hole injection property, a second evaporation source including an organic compound with a hole transport property, a third evaporation source including an organic compound with a hole transport property as a host of an organic compound with a luminescent property, a fourth evaporation source including an organic compound with a luminescent property, a fifth evaporation source including an organic compound with a blocking property, and a sixth evaporation source including an organic compound with an electron transport property.

When these organic compounds are deposited by vacuum evaporation in order, the organic compound layer including regions with functions of the hole injection property, the hole transport property, the luminescent property, the blocking property, and the electron transport property can be formed on the anode.

Moreover, the deposition apparatus A906 is provided with a low-pressure mercury lamp as a light source and irradiated by a wavelength of 184.9 nm of light.

Also, in this embodiment, in order to form a mixed region in an interface between different function regions, organic compounds for forming both function regions are simultaneously deposited by vacuum evaporation. That is, the mixed regions are formed respectively at an interface between a hole injection region and a hole transport region, an interface between the hole transport region and a hole transport region including a luminescent region, an interface between the hole transport region including the luminescent region and a blocking region, and an interface between the blocking region and an electron transport region.

Noted that in the above explanation the organic compound layer is formed by successive vacuum evaporation from six evaporation sources provided with six organic compounds having different functions respectively as the first organic compound layer. The present invention should not be limited only to the above and is modifiable as far as a plurality of evaporation sources. Also, an organic compound provided in a single evaporation source is not limited to have one kind, may be a plurality of ones. For instance, in addition to a single kind of material provided in an evaporation source as the organic compound with luminescent ability, another organic compound that serve as a dopant may be provided together. Additionally, as the organic compounds having the plurality of functions and forming the organic compound layer which emits red light, the ones as indicated in Embodiment 1 is employable, although known materials are freely used in combination where necessary.

It is also noted that the deposition chamber A906 is coupled via a gate 900g to a material exchange chamber 914. Also note that the material exchange chamber 914 is provided with a heater for heating organic compounds exchanged. Preheating such organic compounds makes it possible to remove impurities such as water or the like. It will be desirable that a temperature being applied here be 200° C. or below. In addition, since the material exchange chamber 914 is provided with a vacuum pump capable of setting its interior in a pressure reduction, let the interior be set in such vacuum pressure state after heat up processing by addition or exchange of an organic compound from the outside. And, when it becomes the same pressure state as that within the deposition chamber, open the gate 900g to thereby enable the evaporation source within the deposition chamber to be provided with an organic compound. Additionally the organic compound is provided at the evaporation source within the deposition chamber by means of a transfer mechanism.

Additionally, regarding the deposition process within the deposition chamber A906, refer to the explanation of FIG. 4A.

Note that in a similar way to the alignment chamber 905, a cleaning preliminary chamber 922b is coupled to the deposition chamber A906 via a gate (not shown). Additionally its practical arrangement is similar to that of the cleaning preliminary chamber 922a, thus, it is possible by introducing radicals generated in the cleaning preliminary chamber 922b into the deposition chamber A906 to remove organic compounds and the like being internally attached to the deposition chamber A906.

Next, numeral 908 denotes a deposition chamber used for deposition of a second organic compound layer by vacuum evaporation method, which will be called the deposition chamber B908 hereinafter. The deposition chamber B908 is coupled via a gate 900d to the transfer chamber 901. In this embodiment a deposition chamber with the structure shown in FIG. 4A is provided as the deposition chamber B908. With this embodiment, the second organic compound layer capable of emitting green light is formed at a deposition unit 909 within the deposition chamber B708.

The deposition chamber B908 is provided with a plurality of evaporation sources, concretely, a first evaporation source including an organic compound with a hole injection property, a second evaporation source and a third evaporation source, each including an organic compound with a hole transport property, a fourth evaporation source including a host material with a hole transport property, a fifth evaporation source including an organic compound with a luminescent property, a sixth evaporation source including an organic compound with a blocking property, and a seventh evaporation source including an organic compound with an electron transport property.

When these organic compounds are deposited by vacuum evaporation in order, the second organic compound layer comprising regions with functions of the hole injection property, the hole transport property, the luminescent property, the blocking property, and the electron transport property can be formed on the anode.

Moreover, the deposition chamber B908 is provided with a low-pressure mercury lamp as a light source and irradiated by a wavelength of 184.9 nm of light.

Also, in this embodiment, in order to form a mixed region in an interface between different function regions, organic compounds for forming both function regions are simultaneously deposited by vacuum evaporation. That is, the respective mixed regions are formed in an interface between a hole injection region and a hole transport region, an interface between the hole transport region and a hole transport region including a luminescent region, an interface between the hole transport region including the luminescent region and a blocking region, and an interface between the blocking region and an electron transport region.

Noted that in the above explanation the organic compound layer is formed by successive vacuum evaporation from seven evaporation sources provided with seven organic compounds having different functions respectively as the second organic compound layer. The present invention should not be limited only to the above and is modifiable as far as a plurality of evaporation sources. Also, an organic compound provided in a single evaporation source is not limited to have one kind, may be a plurality of ones. For instance, in addition to a single kind of material provided in an evaporation source as the organic compound with luminescent ability, another organic compound that serve as a dopant may be provided together. Additionally, as the organic compounds having the plurality of functions and forming the organic compound layer which emits green light, the ones as indicated in Embodiment 1 is employable, although known materials are freely used in combination where necessary.

It is also noted that the deposition chamber B908 is coupled via a gate 900h to a material exchange chamber 915. Also note that the material exchange chamber 915 is provided with a heater for heating organic compounds exchanged. Preheating such organic compounds makes it possible to remove impurities such as water or the like. It will be desirable that a temperature being applied here be 200° C. or below. In addition, since the material exchange chamber 915 is provided with a vacuum pump so that after introducing organic compounds from the outside it is possible to set its interior in a pressure reduction by the vacuum pump. And, when it becomes the same pressure state as that within the deposition chamber, open the gate 900h to thereby enable the evaporation source within the deposition chamber to be provided with an organic compound. Additionally the organic compound is provided at the evaporation source within the deposition chamber by means of a transfer mechanism.

Additionally, regarding the deposition process within the deposition chamber B908, refer to the explanation of FIG. 4A.

Note that in a similar way to the alignment chamber 905, a cleaning preliminary chamber 922c is coupled to the deposition chamber B908 via a gate (not shown). Additionally its practical arrangement is similar to that of the cleaning preliminary chamber 922a, thus, it is possible by introducing radicals generated in the cleaning preliminary chamber 922c into the deposition chamber B908 to remove organic compounds and the like being internally attached to the deposition chamber B908.

Next, numeral 910 denotes a deposition chamber used for deposition of a third organic compound layer by vacuum evaporation method, which will be called the deposition chamber C910 hereinafter. The deposition chamber C910 is coupled via a gate 900e to the transfer chamber 901. In this embodiment a deposition chamber with the structure shown in FIG. 4A is provided as the deposition chamber C910. With this embodiment, the third organic compound layer capable of emitting blue light is formed at a deposition unit 911 within the deposition chamber C910.

A plurality of evaporation sources are provided with the deposition chamber C910, practically, there are provided a first evaporation source comprising an organic compound with hole injectability, a second evaporation source comprising an organic compound with luminescent ability, a third evaporation source comprising an organic compound with blocking ability, and a fourth evaporation source comprising an organic compound with electron transportability.

Note that sequential vacuum evaporation of these organic compounds makes it possible to form on the anode an organic compound layer consisting essentially of regions having functions of hole injectability, luminescent ability, blocking ability and electron transportability.

Moreover, the deposition chamber C910 is provided with a low-pressure mercury lamp as a light source and irradiated by a wavelength of 184.9 nm of light.

Additionally in this embodiment, a mixed region is formed at an interface between different function regions by simultaneous vacuum evaporation of organic compounds forming such both function regions. More specifically, several mixed regions are formed at an interface between the hole injection region and the luminescent region, at an interface between the luminescent region and the blocking region, and at an interface between the blocking region and electron transport region, respectively.

Noted that in the above explanation the organic compound layer is formed by successive vacuum evaporation from four evaporation sources provided with four organic compounds having different functions respectively as the third organic compound layer. The present invention should not be limited only to the above and is modifiable as far as a plurality of evaporation sources. Also, an organic compound provided in a single evaporation source is not limited to have one kind, may be a plurality of ones. For instance, in addition to a single kind of material provided in an evaporation source as the organic compound with luminescent ability, another organic compound that serve as a dopant may be provided together. Additionally, as the organic compounds having the plurality of functions and forming the organic compound layer which emits blue light, the ones as indicated in Embodiment 1 is employable, although known materials are freely used in combination where necessary.

It is also noted that the deposition chamber C910 is coupled via a gate 900i to a material exchange chamber 916. Also note that the material exchange chamber 715 is provided with a heater for heating organic compounds exchanged. Preheating such organic compounds makes it possible to remove impurities such as water or the like. It will be desirable that a temperature being applied here be 200° C. or below. In addition, since the material exchange chamber 916 is provided with a vacuum pump so that after introducing organic compounds from the outside it is possible to set its interior in a pressure reduction by the vacuum pump. And, when it becomes the same pressure state as that within the deposition chamber, open the gate 900i to thereby enable the evaporation sources within the deposition chamber to be provided with organic compounds. Additionally the organic compound is provided at the evaporation source within the deposition chamber by means of a transfer mechanism.

Additionally, regarding the deposition process within the deposition chamber C910, refer to the explanation of FIG. 4A.

Note that in a similar way to the alignment chamber 905, a cleaning preliminary chamber 922d is coupled to the deposition chamber C910 via a gate (not shown). Additionally its practical arrangement is similar to that of the cleaning preliminary chamber 922a, thus, it is possible by introducing radicals generated in the cleaning preliminary chamber 922d into the deposition chamber C910 to remove organic compounds and the like being internally attached to the deposition chamber C910.

Next, numeral 912 indicates a deposition chamber for fabricating by vacuum evaporation method a conductive film used as either the anode or cathode of a luminescent element (in this embodiment, a metal film used as the cathode), which chamber will be called the deposition chamber D912. This deposition chamber D912 is coupled via a gate 900f to the transfer chamber 901. In this embodiment, at the deposition unit 913 within the deposition chamber D912, an Al—Li alloy film (alloy film of aluminum and lithium) is to be formed as the conductive film used as the cathode of the luminescent element. It will also be possible to perform co-vacuum evaporation of both aluminum and an element belonging to either the group I or group II of the periodic table at a time. The term co-vacuum evaporation refers to a vacuum evaporation method that evaporation sources are heated simultaneously and different materials are mixed together at the deposition step.

It is also noted that the deposition chamber D912 is coupled via a gate 900j to a material exchange chamber 917. Also note that the material exchange chamber 717 is provided with a heater for heating organic compounds exchanged. Preheating such organic compounds makes it possible to remove impurities such as water or the like. It will be desirable that a temperature being applied here be 200° C. or below. In addition, since the material exchange chamber 917 is provided with a vacuum pump so that after introducing conductive materials from the outside it is possible to set its interior in a pressure reduction by the vacuum pump. And, when it becomes the same pressure state as that within the deposition chamber, open the gate 900j to thereby enable the evaporation sources within the deposition chamber to be provided with conductive materials.

Note that in a similar way to the alignment chamber 905, a cleaning preliminary chamber 922e is coupled to the deposition chamber D912 via a gate (not shown). Additionally its practical arrangement is similar to that of the cleaning preliminary chamber 922a, thus, it is possible by introducing radicals generated in the cleaning preliminary chamber 922e into the deposition chamber D912 to remove conductive materials and the like being internally attached to the deposition chamber D912.

In addition a respective one of the deposition chamber A906, the deposition chamber B908, the deposition chamber C910 and deposition chamber D912 comprises a mechanism for heating the interior of each deposition chamber. Whereby it is possible to remove part of impurities such as moisture in the deposition chambers.

Further note that although dry pumps, mechanical booster pumps, turbo molecular pumps (magnetic floatation type) or cryopumps are employable as the vacuum pumps provided in these deposition chambers, it is desirable that the cryopumps and dry pumps be used in this embodiment.

Pressures in the deposition chamber A906, the deposition chamber B908, the deposition chamber C910 and the deposition chamber D912 are reduced by exhaust pumps. At this time, the degree of vacuum to be reached is desirably $10^{-6}$ Pa or more. For example, when a cryopump having an exhaust rate of 36000 l/s ($H_2O$) is used and a surface area of the inner of the deposition chamber is 1.5 $m^2$, the inner of the deposition chamber is preferably made of a material such as 18-8 stainless steel having a leak rate of $9.3*10^{-7}$ $Pa*m^3*s^{-1}$ or less. In order to obtain such a degree of vacuum, it is effective that the surface area of the inner of the deposition chamber is reduced by electropolishing because absorption of an impurity such as oxygen or water can be decreased.

In addition, a material such as aluminum mirror-finished by electropolishing is used for the inner wall surface of the deposition chamber. Also, an inner member made of a material such as ceramics, which is processed so as to extremely reduce pores is used. These materials have a surface evenness such as an average surface roughness is 5 nm or less (preferably, 3 nm or less). The average surface roughness as described here is three-dimensionally extended in order to applicate a roughness such that a center line average roughness as defined by JIS B0601 to a surface.

In addition, there is also a method of forming an active surface on the inner wall of the deposition chamber using a material which is easy to react with a gas. Ti, Zr, Nb, Ta, Cr, Mo, W, La, Ba or the like may be used as a material in this case.

Next, numeral 918 denotes a sealing chamber (also known as an enclosing chamber or glove box), which is coupled via a gate 900k to the load chamber 904. In the sealing chamber 918, processing for finally enclosing a luminescent element into a sealed space is performed. This processing is for protection of the formed luminescent element against oxygen and water, which employs a means for mechanically enclosing by cover material or alternatively enclosing by using either thermally hardenable resin or ultraviolet ray hardenable resin material.

While the cover material used may be glass, ceramics, plastic or metal, the cover material must have optical transmissivity in cases where light is emitted toward the cover material side. Additionally the cover material and a substrate with the above-stated luminescent element formed thereon are adhered together by use of a sealant such as thermal hardenable resin or ultraviolet-ray hardenable resin or else, thereby forming an air-tight sealed space by letting the resin be hardened through thermal processing or ultraviolet ray irradiation processing. It is also effective to provide in this sealed space a moisture absorbable material, typical example of which is barium oxide.

It will also be possible to fill the space between the cover material and the substrate having the luminescent element formed thereon with either thermal hardenable resin or ultraviolet-ray hardenable resin. In this case, it is effective to add a moisture absorption material typically such as barium oxide into either the thermal hardenable resin or ultraviolet-ray hardenable resin.

In the deposition apparatus shown in FIG. 10A, a mechanism 919 for irradiation of ultraviolet light to the interior of the sealing chamber 918 (referred to as the "ultraviolet light irradiation mechanism" hereinafter) is provided, which is arranged so that ultraviolet light as emitted from this ultraviolet light irradiation mechanism 919 is used to harden the ultraviolet-ray hardenable resin. Attachment of a vacuum pump makes also possible to reduce pressure within the sealing chamber 918. In case the above sealing process is done mechanically by robot operation, it is possible by performing this process to prevent mixture of oxygen and water because of atmosphere in reduced pressure. Practically it is desired that the concentrations of such oxygen and water be made less than or equal to 0.3 ppm. Additionally it is also possible that the interior of the seal chamber 918 is pressurized adversely. In this case, the sealing chamber 918 is purged by a nitride gas or noble gas of high purity and pressurized, thereby the invasion of oxygen or the like from the outside is prevented.

Next, a delivery chamber (pass box) 920 is coupled to the sealing chamber 918. The delivery chamber 920 is provided with a transfer mechanism B921 for transferring toward the delivery chamber 920 a substrate which sealing of the luminescent element is completed in the sealing chamber 918. The delivery chamber 920 also can be set in a reduced pressure state by attachment of a vacuum pump thereto. This delivery chamber 920 is the facility that prevents the sealing chamber 918 from being exposed directly to the outside air, from which the substrate is removed. Optionally it is also possible to provide a member supply chamber (not shown) for supplying members to be used in the sealing chamber.

It must be noted that although not shown in diagrams of this embodiment, insulating films with lamination of chemical compounds including silicon such as silicon nitride or silicon oxide and with lamination of a diamond like carbon (DLC) film containing carbon on these chemical compounds may be formed on a luminescent element after forming the luminescent element. Additionally the term diamond-like carbon (DLC) film refers to an amorphous film with a mixture of diamond bonding ($sp^3$ bond) and graphite bond ($SP^2$ bond). Note that in this case, a deposition chamber may be provided which comprises a chemical vapor deposition (CVD) apparatus for generating a plasma by application of a self bias to thereby form a thin film through plasma discharge decomposition of material gases.

Note that in the deposition chamber comprising such chemical vapor deposition (CVD) apparatus, there may be used oxygen ($O_2$), hydrogen ($H_2$) methane ($CH_4$), ammonia ($NH_3$) and silane ($SiH_4$). Also note that as the CVD apparatus, there is employable the one that has electrodes of the parallel flat-plate type with RF power supply of 13.56 MHz.

Further, it is also possible to provide a deposition chamber for performing deposition by sputtering methods (also called sputter methods). This is due to the fact that deposition by sputtering is effective in the case of forming the anode after forming organic compound layers, on the cathode of a luminescent element. In other words, it is effective in cases where a pixel electrode is the cathode. Additionally the interior of such deposition chamber is set at an atmosphere with oxygen added to argon during deposition whereby the concentration of oxygen in a film thus fabricated is well controlled to enable formation of a low resistance film that is high in optical transmissivity. Also note that it will be desirable that the deposition chamber be shielded by a gate from the transfer chamber in a similar manner to the remaining deposition chambers.

It is to be noted that in the deposition chamber for sputtering, a mechanism may be provided which is operable to control the temperature of such substrate deposited. Additionally it is desirable that the substrate deposited be kept at temperature ranging from 20 to 150° C. Further, although a dry pump, mechanical booster pump, turbo molecular pump (magnetic floatation type) or cryopump is useable as a vacuum pump to be provided in the deposition chamber, the cryopump and the dry pump are preferably employed in this embodiment.

As apparent from the foregoing, the use of the deposition apparatus shown in FIGS. 10A and 10B makes it possible to prevent exposure of a luminescent element to the outside air until the luminescent element is completely enclosed in an air-tight sealed space, which in turn enables successful manufacture of a luminescent device with high reliability.

Embodiment 3

Figure 11A:
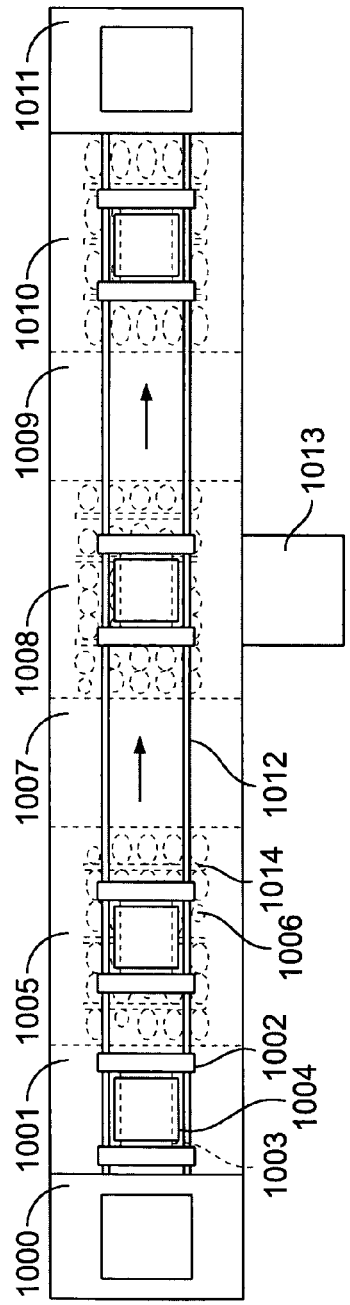
FIGS. 11A and 11B are views for explaining the deposition apparatus.
Figure 11B:
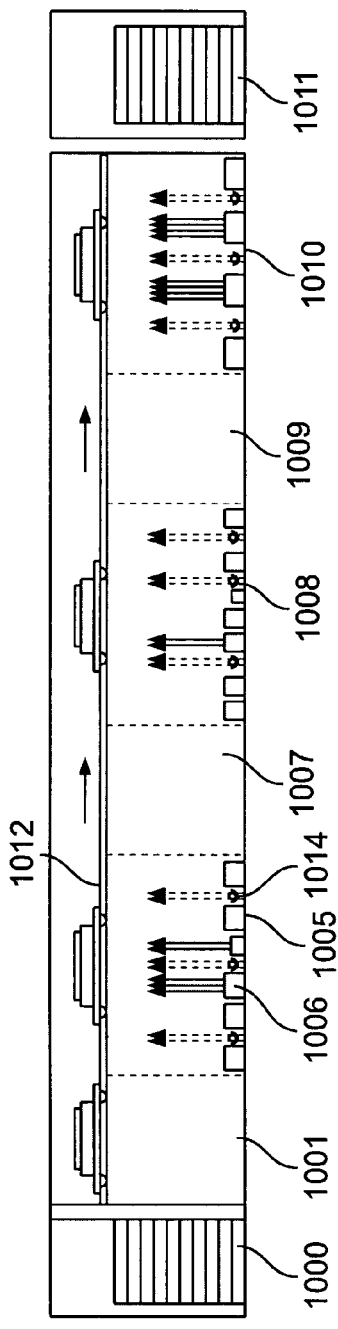

The present embodiment explains the in-line type deposition apparatus shown in Embodiment 1, a substrate transporting method and a deposition apparatus different in structure of the deposition chamber, using FIGS. 11A and 11B.

In FIGS. 11A and 11B, a substrate 1004 as loaded into a load chamber 1000 is transported toward a first alignment unit 1001 which is coupled thereto via a gate (not shown). Note that the substrate 1004 is subjected to alignment by the method discussed in FIGS. 6A through 6E and then fixed to a holder 1002 along with a metal mask 1003.

And, the substrate 1004 is transferred to a first deposition unit 1005 together with the holder 1002. Note here that the first alignment unit 1001 and the first deposition unit 1005 are coupled together via no gates and have the same space. Then, in this embodiment, a rail 1012 is provided as a means for enabling free movement between the first alignment unit 1001 and the first deposition unit 1005, wherein each processing is to be done while the holder 1002 is moving along this rail. Additionally the processing position during alignment and deposition is controlled by a control mechanism owned by the holder 1002.

In the first deposition unit 1005, vacuum evaporation is made from a plurality of evaporation sources 1006 respectively prepared with different organic compounds, and a first organic compound layer is formed. Incidentally, the first deposition unit 1005 is provided with a low-pressure mercury lamp as a light source 1014. During deposition, a wavelength of 184.9 nm of light is irradiated to the organic compound molecules vaporized and evaporated from the evaporation source 1006 and to the organic compound molecules already deposited on the substrate.

Next, the substrate is transported by the moving means explained before to a second alignment unit 1007 and a second deposition chamber unit 1008 to form a second organic compound layer.

In the second deposition unit 1008, a second organic compound layer is formed by vacuum evaporating organic compounds from a plurality of evaporation sources respectively prepared with different organic compounds. Incidentally, the second deposition chamber unit 1008 is similarly provided with a low-pressure mercury lamp as a light source. During deposition, a wavelength of 184.9 nm of light is irradiated to the organic compound molecules vaporized and evaporated from the evaporation source and to the organic compound molecules already deposited on the substrate.

Furthermore, in the case of forming a third organic compound, transportation is similarly made to a third alignment unit 1009 and a third deposition unit 1010.

In the third deposition unit 1010, the deposition is made by a plurality of evaporation sources respectively prepared with different organic compounds to form a third organic compound layer. Incidentally, the third deposition chamber 1010 is similarly provided with a low-pressure mercury lamp as a light source. During deposition, a wavelength of 184.9 nm of light is illuminated to the organic compound molecules vaporized and evaporated from the evaporation source and to the organic compound molecules already deposited on the substrate.

As described above, the present embodiment can form three kinds of organic compound layers within the same space. The third deposition unit 1010 is connected with an unload chamber 1011 through a gate (not shown) where the substrate after deposition can be taken out.

Incidentally, the process within the alignment section and deposition section in this embodiment may be made similarly to that explained in the alignment chamber and deposition chamber of Embodiment 1.

Meanwhile, in this embodiment, the provision of a partition wall between the alignment section and the deposition section to partition them in a degree not to prevent substrate transportation makes it possible to prevent the organic compound evaporated from the evaporation source from evaporating to the other place than the deposition region (alignment section and other deposition section) during deposition.

Meanwhile, in the deposition apparatus of this embodiment, a cleaning preparatory chamber 1013 also is preferably provided to conduct cleaning of the deposition-chamber interior and metal mask.

By forming a plurality of organic compound layers within the same space with using the deposition apparatus explained above, the movement is facilitated in forming the different organic compound layers, thereby making possible to shorten the process time.

Meanwhile, the deposition apparatus shown in this embodiment can carry out continuous deposition within the deposition chamber thereby forming three kinds of organic compound layers having a plurality of functions on a substrate formed with up to an anode or cathode for a light-emitting element. Furthermore, a deposition chamber for depositing a conductive film may be provided to continuously form up to a cathode or anode for a light-emitting element. Incidentally, the conductive film, where forming a cathode, may use, besides an Al—Li alloy film (alloy film of aluminum and lithium), a film obtainable by co-depositing an element of group 1 or group 2 of the periodic table and aluminum. Where forming an anode, indium oxide, tin oxide, zinc oxide or a compound thereof (ITO, etc.) or the like may be used.

Besides the above, it is possible to provide a process chamber for sealing a manufactured light-emitting device.

Meanwhile, the deposition apparatus of this embodiment can be provided with a gas-discharge pump as shown in Embodiment 1 or Embodiment 2. However, in order to make constant the pressure within the deposition chambers, it is satisfactory to provide pumps singly or in plurality that are of the same kind and the same discharge capacity. Incidentally, it is preferred to use a combination of a dry pump and a cryopump.

Embodiment 4

Figure 12:
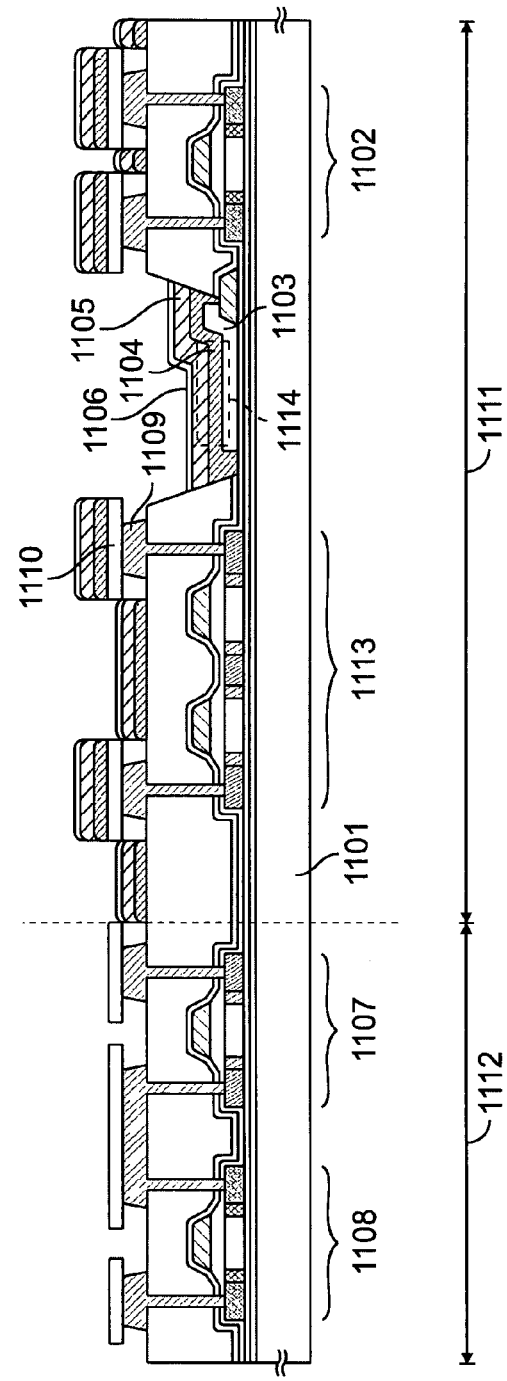
FIG. 12 is a view for explaining a light-emitting device.

In this embodiment an explanation will be given of a luminescent device manufactured by use of the deposition apparatus of the present invention. FIG. 12 is a diagram showing a cross-sectional view of an active matrix type luminescent device. Note that although thin film transistors (referred to as "TFTs" hereinafter) are employed as active elements, these are replaceable by MOS transistors.

Additionally, although top gate type TFTs (practically planar type TFTs) will be exemplarily indicated as the TFTs, bottom gate type TFTs (typically, inverse stagger type TFTs) is alternatively employable.

In FIG. 12, numeral 1101 denotes a substrate, here, which permits transmission of visible light rays. Practically, a glass substrate, a quartz substrate, a crystallized glass substrate or plastic substrate (including a plastic film) are useable. Note that the substrate 1101 includes an insulating film provided on the surface thereof.

A pixel portion 1111 and a drive circuit 1112 are provided on the substrate 1101. The pixel portion 1111 will first be explained below.

The pixel portion 1111 is a region that performs image displaying. A plurality of pixels are present on the substrate, each of which is provided with a TFT 1102 for control of a current flowing in a luminescent element (referred to hereinafter as current controlling TFT), a pixel electrode (anode) 1103, an organic compound layer 1104 and a cathode 1105. In addition, numeral 1113 denotes a TFT for controlling a voltage applied to the gate of the current controlling TFT (referred to as switching TFT hereinafter).

Preferably here, the current controlling TFT 1102 is a p-channel type TFT. Although it may alternatively be an n-channel TFT, the use of p-channel TFT makes it possible to suppress consumption of electrical power in case the current controlling TFT is connected to the anode of the luminescent element as shown in FIG. 12. Note however that the switching TFT 1113 may be either n-channel TFT or p-channel TFT.

It is noted that drain of the current controlling TFT 1102 is electrically connected with the pixel electrode 1103. In this embodiment, since the pixel electrode 1103 is used a conductive material with its work function within a range of 4.5 to 5.5 eV, the pixel electrode 1103 functions as the anode of the luminescent element. The pixel electrode 1103 may typically be made of indium oxide, tin oxide, zinc oxide, or compounds thereof (such as ITO). The organic compound layer 1104 is provided on the pixel electrode 1103.

Further, the cathode 1105 is provided on the organic compound layer 1104. It is desirable that the cathode 1105 be made of a conductive material with its work function ranging from 2.5 to 3.5 eV. The cathode 905 is typically made from a conductive film containing alkaline metal elements or alkali rare metal elements, a conductive film containing aluminum, and one that aluminum or silver is laminated on the above conductive films.

In addition the luminescent element 1114 comprising the pixel electrode 1103, the organic compound layer 1104, and cathode 1105 is covered with a protective film 1106. This protective film 1106 is provided for protection of the luminescent element 1114 against oxygen and water. The protective film 1106 is made of material such as silicon nitride, silicon oxynitride, aluminum oxide, tantalum oxide or carbon (typically, diamond like carbon).

An explanation will next be given of the drive circuit 1112. The drive circuit 1112 is the region that controls the timing of signals (gate signal and data signal) being sent to the pixel portion 1111, which is provided with a shift register, a buffer, a latch, an analog switch (transfer gate), or a level shifter. In FIG. 12 a CMOS circuit is shown which is made up of an n-channel TFT 1107 and p-channel TFT 1108 for use as a basic unit of these circuits.

The circuit structure of the shift register, the buffer, the latch, the analog switch (transfer gate) or the level shifter may be designed in a known way. Additionally although in FIG. 12 the pixel portion 1111 and the drive circuit 1112 are provided on the same substrate, it is also possible to electrically connect IC and LSI without providing the drive circuit 1112.

Additionally, although in FIG. 12 the pixel electrode (anode) 1103 is electrically connected to the current controlling TFT 1102, this may be modified into a structure with the cathode connected to the current controlling TFT. In such case, the pixel electrode 1103 may be made of the same material as that of the cathode 1105 while letting the cathode be made of similar material to that of the pixel electrode (anode) 1103. In such case it will be preferable that the current controlling TFT be an n-channel TFT.

It is also noted that in this embodiment, a shape with an eave (called the eave structure hereinafter) consisting essentially of a wiring line 1109 and a separation portion 1110 is provided. The eave structure made of the wiring line 1109 and the separation portion 1110 shown in FIG. 12 is manufacturable by a method having the steps of laminating a metal constituting the wiring line 1109 and a material (e.g. metal nitrides) that forms the separation portion 1110 and has a lower etch rate than the metal and then of etching the same. With use of this shape, it is possible to prevent the pixel electrode 1103 and the wiring line 1109 from electrically shorting with the cathode 1105. Additionally in this embodiment, unlike standard active matrix type luminescent devices, the cathode 1105 on a pixel is formed into a stripe shape (in a similar manner to that of the cathode of a passive matrix).

Figure 13A:
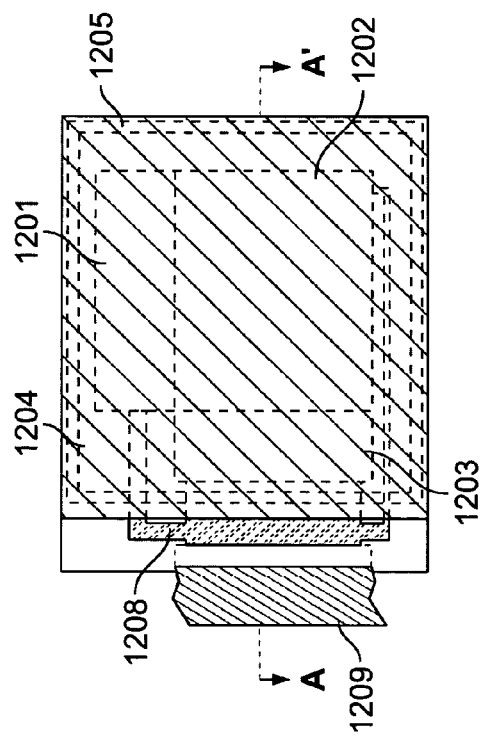
FIGS. 13A and 13B are views for explaining a sealing structure.
Figure 13B:
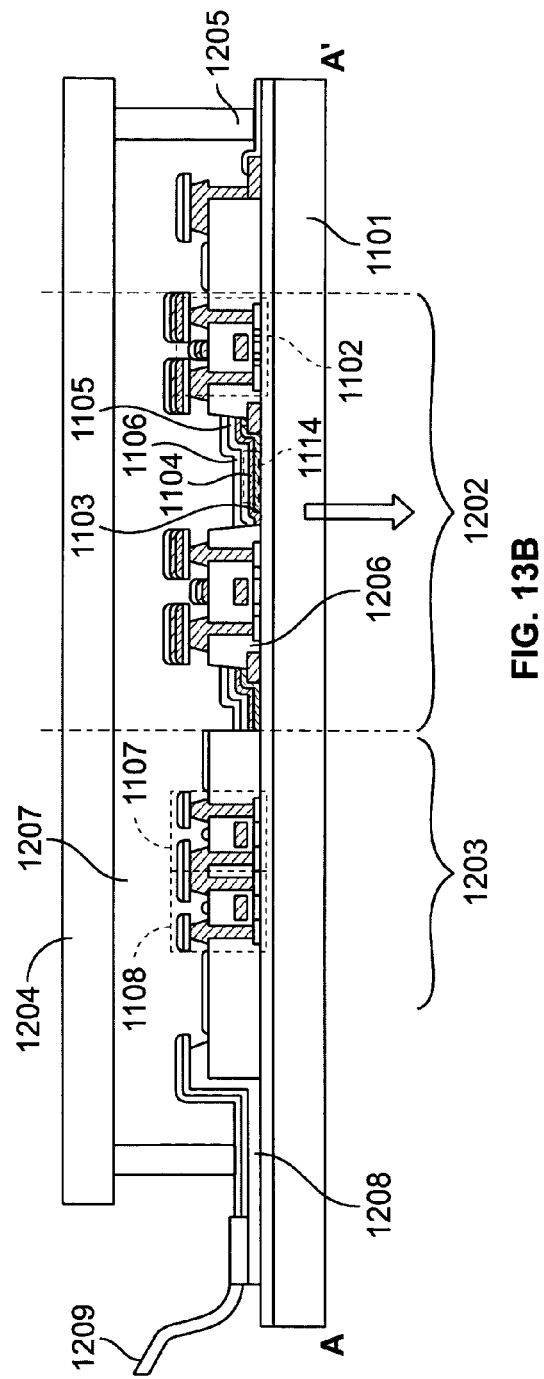

Here, an appearance of the active matrix type luminescent device of FIG. 12 is shown in FIGS. 13A and 13B. Note here that an upper plan view is shown in FIG. 13A whereas a sectional view taken along line A-A' of FIG. 13A is shown in FIG. 13B. Additionally the reference numerals used in FIG. 12 are also used here.

Numeral 1201 indicated by dotted lines denotes a source side drive circuit; 1202 denotes a pixel portion; 1203 is a gate side drive circuit. In addition, 1204 indicates a cover material, and 1205 is a sealant, wherein a space 1207 is provided in interior part surrounded by the sealant 1205.

Additionally, numeral 1208 denotes a wiring line which transfers signal as input to the source side drive circuit 1201 and gate side drive circuit 1203, which receives a video signal and a clock signal from a flexible printed circuit (FPC) 1209 for use as an external input terminal. Note that although the FPC alone is depicted herein, a printed wiring board (PWB) is attachable to this FPC. The luminescent device of the subject patent application includes an IC-mounted luminescent module as well as a luminescent module with either the FPC or the PWB attached onto a luminescent panel.

An explanation will next be given of the sectional structure with reference to FIG. 13B. The pixel portion 1202 and the gate side drive circuit 1203 are formed at upper part of the substrate 1101, wherein the pixel portion 1202 is formed of a plurality of pixels each including the current controlling TFT 1102 and the pixel electrode 1103 electrically connected to the drain of the current controlling TFT. Additionally the gate side drive circuit 1203 is formed using a CMOS circuit with a combination of the n-channel TFT 1107 and the p-channel TFT 1108.

The pixel electrode 1103 functions as the anode of a luminescent element. In addition an interlayer insulating film 1206 is formed at the opposite ends of the pixel electrode 1103, and the organic compound layer 1104 and the cathode 1105 of the luminescent element are formed on the pixel electrode 1103.

The cathode 1105 also serves as a common wiring line for a plurality of pixels and is electrically connected via a connection lead 1208 with the FPC 1209. Further all the elements involved in the pixel portion 1202 and the gate side drive circuit 1203 are covered with the protective film 1106.

Note that the cover material 1204 is adhered by the sealant 1205. Additionally a spacer formed of a resin film may be provided in order to retain a distance between the cover material 1204 and the luminescent element. And an interior of the sealant 1205 becomes a sealed space, in which a inactive gas such as nitrogen or argon or else is filled. Optionally it is also be effective to provide in this sealed space a moisture absorption material such as barium oxide.

Note that while a glass, a ceramics, a plastic or metals is usable as the cover material, it must be optical transmissivity in the case of irradiating light onto the cover material side. Additionally fiberglass-reinforced plastics (FRP), polyvinylfluoride (PVF), Mylar, polyester or acryl is useable as the plastic material.

The luminescent element 1114 formed on the substrate is sealed by using the cover material 1204 and the sealant 1205 and thus it is possible to completely shield it from the outside and prevent invasion of material which accelerates degradation of organic compound layers due to oxidation such as water and oxygen. Thus it is possible to obtain the luminescent device with high reliability.

Note that the luminescent device in this embodiment is capable of deposition using the deposition apparatus explained in the embodiments 1 to 3.

Embodiment 5

Figure 14:
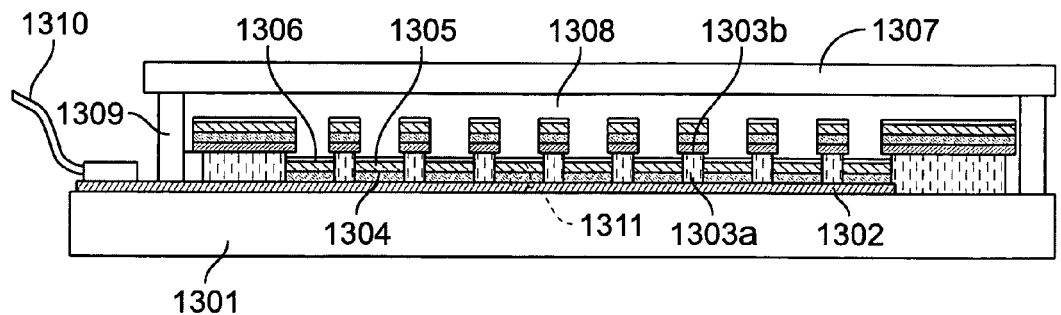
FIG. 14 is a view for explaining a luminescent device.

In this embodiment an explanation is given of a luminescent device of the passive type (simple matrix type) which is manufactured by the deposition apparatus of the present invention with reference to FIG. 14. In FIG. 14, numeral 1301 denotes a glass substrate whereas 1302 denotes an anode formed of a transparent conductive film. In this embodiment a chemical compound comprising indium oxide and zinc oxide is formed by vacuum evaporation as the transparent conductive film. Note that although not shown in FIG. 14, a plurality of anodes are laid out in a direction parallel to the surface of drawing paper sheet.

In addition, cathode partition walls (1303a, 1303b) are formed so that these intersect the anodes 1302 laid out into a stripe shape. The cathode partition walls (1303a, 1303b) are formed in a vertical direction to the surface of the drawing sheet.

Next, an organic compound layer 1304 is formed. The organic compound layer 1304 thus formed here preferably has a plurality of function regions by combination a plurality of organic compounds each of which has function of the hole injectability, hole transportability, luminescent ability, blocking ability, electron transportability or electron injectability.

Note that in this embodiment also, a mixed region is formed between adjacent function regions. Additionally the mixed region is formed by using the method indicated in the embodiments stated supra.

Also note that these organic compound layers 1304 are formed along grooves defined by the cathode partition walls (1303a, 1303b) and thus are laid out into a stripe shape in the vertical direction to the surface of the drawing sheet.

Thereafter, a plurality of cathodes 1305 are laid out into a stripe shape in such a manner that these cross the anodes 1302 with the vertical direction to the surface of the drawing sheet becoming the longitudinal direction thereof. Additionally in this embodiment, the cathodes 1305 are made of MgAg and fabricated by vacuum evaporation. In addition, although not specifically depicted herein, the cathodes 1305 are designed so that a wiring lines are extended to reach portions to which an FPC is attached, thereby enabling application of a given voltage. Further, after forming the cathodes 1305, a silicon nitride film is provided as a protective film 1306.

Through the processes above, a luminescent element 1311 is formed on the substrate 1301. Note here that in this embodiment, lower side electrodes are the anodes 1302 with optical transmittance so that light produced at an organic compound layer emits onto a lower surface (substrate 1301 side). However, it is also possible that the structure of the luminescent element 1311 is reversed to thereby let the lower side electrodes be cathodes with optical shieldability. In such case, light produced at the organic compound layer 1304 is emitted to an upper surface (opposite side to substrate 1301).

Next, prepare a ceramics substrate for use as a cover material 1307. With the structure of this embodiment, though the ceramics substrate is used due to its superiority of light shielding performance, obviously, in case the structure that the luminescent element 1311 is reversed in the way described previously, a substrate made of plastic or glass may be used in view of the fact that the cover material 1307 is better in light transmittance.

The cover material 1307 thus prepared is then adhered by a sealant 1309 made of ultraviolet ray hardenable resin. Note that an interior 1308 of the sealant 1309 becomes an air-tight closed space, which is filled with an inactive gas such as nitrogen or argon. Optionally it will also be effective to provide in this sealed space 1308 a moisture absorption material such as barium oxide. Lastly attach an anisotropic conductive film (FPC) 1310, thus completing the passive type luminescent device.

Embodiment 6

Being self-luminous, a luminescent device using a luminescent element has better visibility in bright places and wider viewing angle than liquid crystal display devices. Therefore various electric appliances can be completed by using the luminescent device of the present invention.

Given as examples of an electric appliance that employs a luminescent device manufactured in accordance with the present invention are video cameras, digital cameras, goggle type displays (head mounted displays), navigation systems, audio reproducing devices (such as car audio and audio components), notebook computers, game machines, portable information terminals (such as mobile computers, cellular phones, portable game machines, and electronic books), and image reproducing devices equipped with recording media (specifically, devices with a display device that can reproduce data in a recording medium such as a digital video disk (DVD) to display an image of the data). Wide viewing angle is important particularly for portable information terminals because their screens are often slanted when they are looked at. Therefore it is preferable for portable information terminals to employ the luminescent device using the luminescent element. Specific examples of these electric appliance are shown in FIGS. 15A to 15H.

Figure 15A:
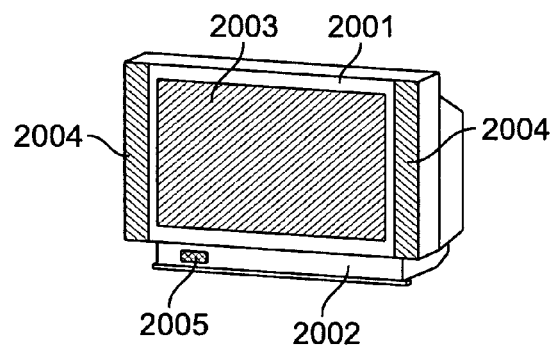
FIGS. 15A through 15H are views showing examples of electric appliances.

FIG. 15A shows a display device, which is composed of a case 2001, a support base 2002, a display unit 2003, speaker units 2004, a video input terminal 2005, etc. The luminescent device manufactured in accordance with the present invention can be applied to the display unit 2003. Since the luminescent device having the luminescent element is self-luminous, the device does not need back light and can make a thinner display unit than liquid crystal display devices. The display device refers to all display devices for displaying information, including ones for personal computers, for TV broadcasting reception, and for advertisement.

Figure 15B:
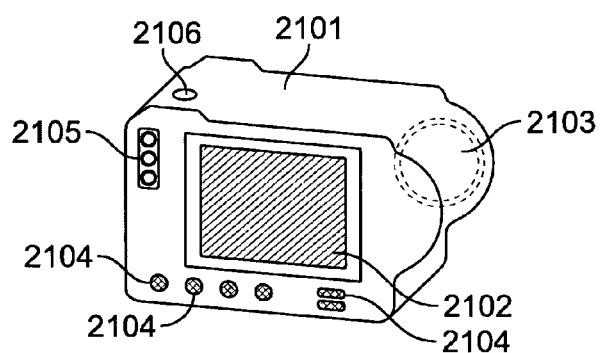

FIG. 15B shows a digital still camera, which is composed of a main body 2101, a display unit 2102, an image receiving unit 2103, operation keys 2104, an external connection port 2105, a shutter 2106, etc. The luminescent device manufactured in accordance with the present invention can be applied to the display unit 2102.

Figure 15C:
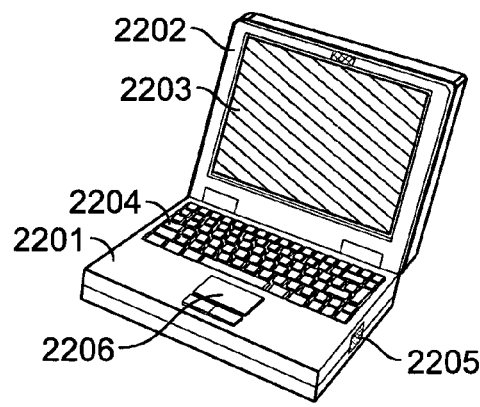

FIG. 15C shows a notebook personal computer, which is composed of a main body 2201, a case 2202, a display unit 2203, a keyboard 2204, an external connection port 2205, a pointing mouse 2206, etc. The luminescent device manufactured in accordance with the present invention can be applied to the display unit 2203.

Figure 15D:
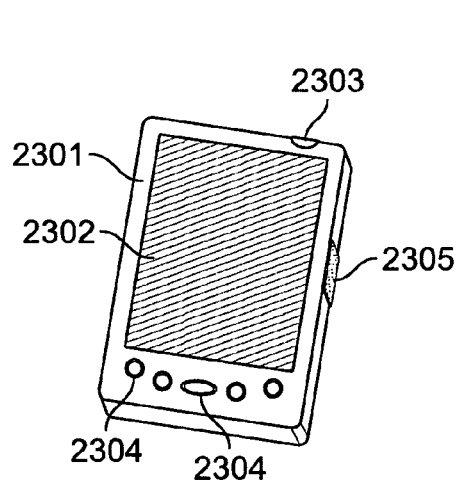

FIG. 15D shows a mobile computer, which is composed of a main body 2301, a display unit 2302, a switch 2303, operation keys 2304, an infrared port 2305, etc. The luminescent device manufactured in accordance with the present invention can be applied to the display unit 2302.

Figure 15E:
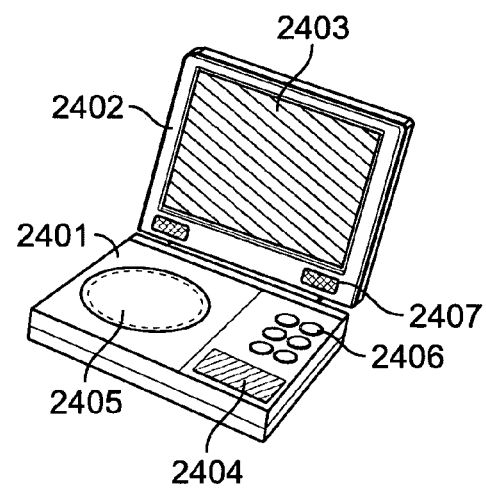

FIG. 15E shows a portable image reproducing device equipped with a recording medium (a DVD player, to be specific). The device is composed of a main body 2401, a case 2402, a display unit A 2403, a display unit B 2404, a recording medium (DVD or the like) reading unit 2405, operation keys 2406, speaker units 2407, etc. The display unit A 2403 mainly displays image information whereas the display unit B 2404 mainly displays text information. The luminescent device manufactured in accordance with the present invention can be applied to the display units A 2403 and B 2404. The image reproducing device equipped with a recording medium also includes home-video game machines.

Figure 15F:
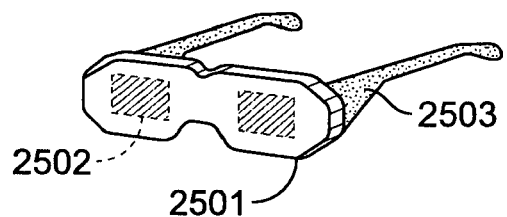

FIG. 15F shows a goggle type display (head mounted display), which is composed of a main body 2501, display units 2502, and arm units 2503. The luminescent device manufactured in accordance with the present invention can be applied to the display units 2502.

Figure 15G:
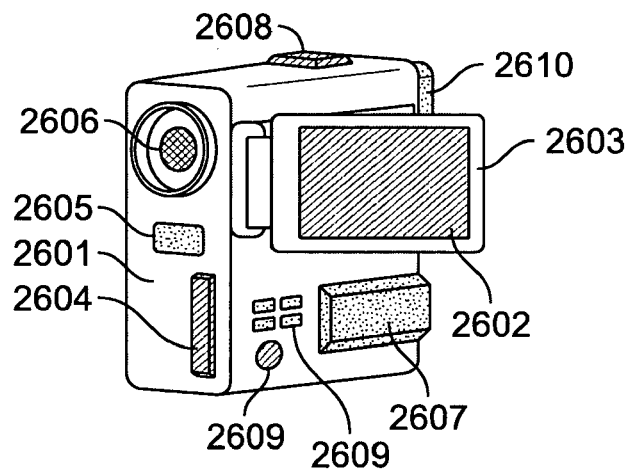

FIG. 15G shows a video camera, which is composed of a main body 2601, a display unit 2602, a case 2603, an external connection port 2604, a remote control receiving unit 2605, an image receiving unit 2606, a battery 2607, an audio input unit 2608, operation keys 2609, eye piece portion 2610 etc. The luminescent device manufactured in accordance with the present invention can be applied to the display unit 2602.

Figure 15H:
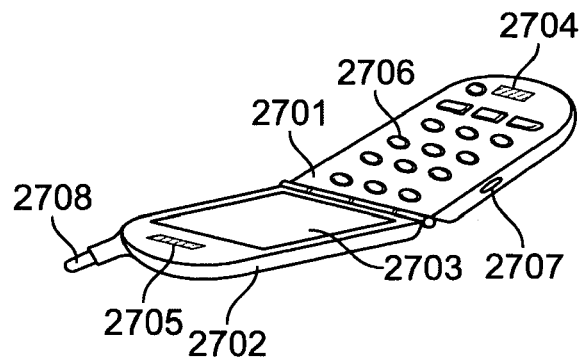
Figure 16:
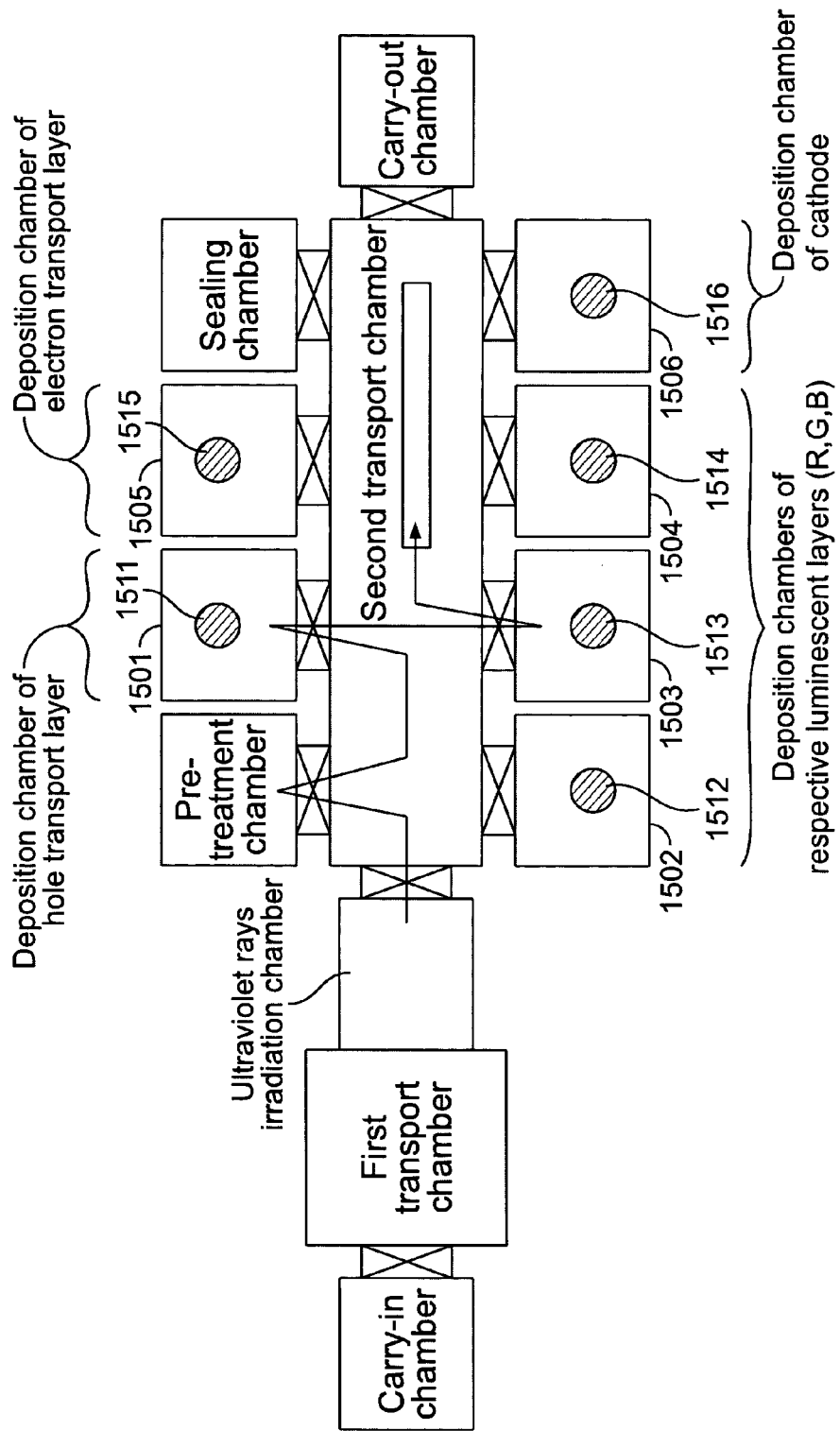
FIG. 16 is a view for explaining a conventional example.
Figure 17A:
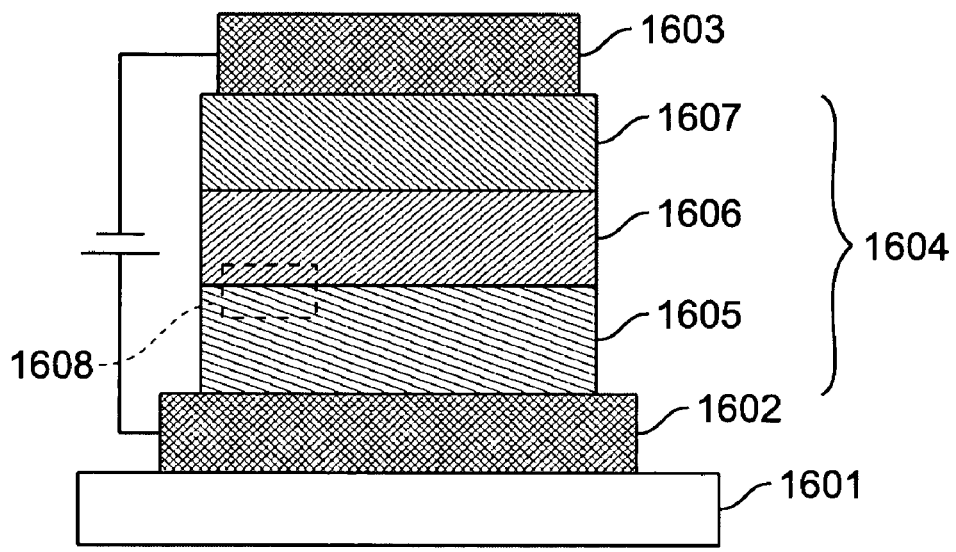
FIGS. 17A and 17B are views for explaining a conventional example.
Figure 17B:
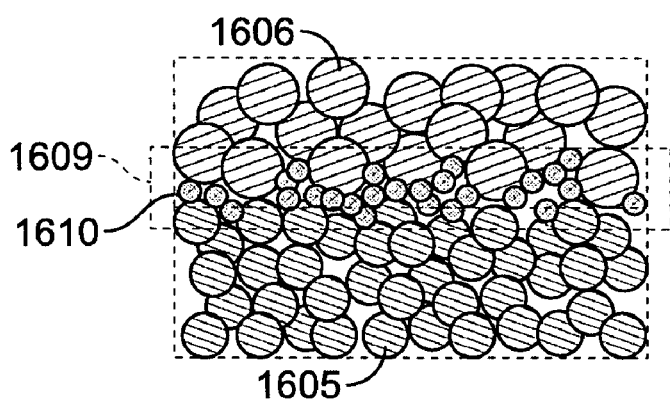

FIG. 15H shows a cellular phone, which is composed of a main body 2701, a case 2702, a display unit 2703, an audio input unit 2704, an audio output unit 2705, operation keys 2706, an external connection port 2707, an antenna 2708, etc. The luminescent device manufactured in accordance with the present invention can be applied to the display unit 2703. If the display unit 2703 displays white letters on black background, the cellular phone consumes less power.

If the luminance of light emitted from organic materials is raised in future, the luminescent device can be used in front or rear projectors by enlarging light that contains outputted image information through a lens or the like and projecting the light.

These electric appliances now display with increasing frequency information sent through electronic communication lines such as the Internet and CATV (cable television), especially, animation information. Since organic materials have very fast response speed, the luminescent device is suitable for animation display.

In the luminescent device, luminescent portions consume power and therefore it is preferable to display information in a manner that requires less luminescent portions. When using the luminescent device in display units of portable information terminals. particularly cellular phones and audio reproducing devices that mainly display text information, it is preferable to drive the device such that non luminescent portions form a background and luminescent portions form text information.

As described above, the application range of the luminescent device manufactured by using the deposition device of the present invention is so wide that it is applicable to electric appliances of any field. The electric appliances of this embodiment can employ as their display units any luminescent device shown in Embodiments 4 or 5, which is formed by the deposition apparatus shown in Embodiments 1 to 3.

Embodiment 7

Next, concerning the luminescent device to be formed in the invention, the present embodiment explains on a method for realizing full color representation on the luminescent element by a different technique from that using organic compounds for R, G and B to exhibit respective colors of light emission as explained so far.

Figure 18A:
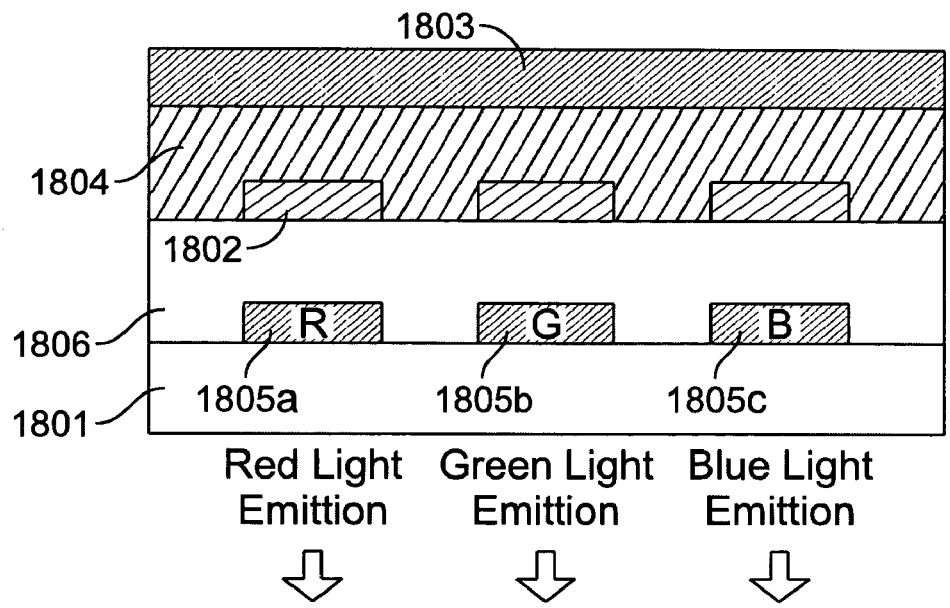
FIGS. 18A and 18B are views for explaining a luminescent element.

First explained is a method combining a white luminescent element with a color filter (hereinafter, referred to as color filter method), with reference to FIG. 18A.

The color filter method is of a scheme to form an organic compound layer for exhibiting white light emission so that the obtained white emission light is passed through a color filter thereby obtaining light emission in red, green and blue.

Although there are various methods to obtain white emission tight, this embodiment explains a case that a pigment, different in light-emission color from the light emission in a luminescent region, is doped in an electron transport layer to mix color with the light-emission color from the luminescent region thereby obtaining white light emission. Incidentally, in this case, light emission is made available in the electron transport region and the luminescent region by adjusting the amount of doping to the electron transport region.

Specifically, the organic compound layer comprises a region formed of an organic compound with electron transportability, a region formed of an organic compound with luminescent ability and a region formed of an organic compound with hole transportability. For example, the organic compound with electron transportability uses $Alq_3$, wherein $Alq_3$ is doped with a dopant such as a styryl pigment of 4-dicyanomethylene-2-methyl-6-(p-dimethylamino-styryl)-4H-pyran (hereinafter, designated as DCM1) or 4-dicyanomethylene-2-methyl-6-juloldine-4-yl-vinyl)-4H-pyran (hereinafter, designated DCM2). Meanwhile, the organic compound with luminescent ability uses a distyryl derivative of 4,4'-bis(2,2-diphenyl-vinyl)-biphenyl (hereinafter, designated DPVBi). The organic compound with hole transportability uses MTDATA. Due to this, an organic compound layer is formed having three kinds of function regions. Note that, in this case, it is also preferred to provide a mixed region of the invention in the interface of these different function regions.

With the organic compound layer 1804 formed by the above, red light emission is obtained in an electron transport region and blue light emission in a luminescent region thereby obtaining white light emission in the entirety.

Incidentally, the organic compound layer 1804 is formed between an anode 1802 and a cathode 1803. By the recombination between holes injected from the anode and electrons injected from the cathode in the organic compound layer 1804, white light emission is obtained in the organic compound layer 1804.

Meanwhile, a luminescent element are formed on a substrate 1801. By providing a color filter (R) 1805a for absorbing the other portion of red emission light, a color filter (G) 1805b for absorbing the other portion of green emission light and a color filter (B) 1805c for absorbing the other portion of blue emission light through an anode 1802 and an insulating film 1806 of the luminescent element, respectively, the white emission light from the luminescent element is separated at the respective filters to obtain red, green and blue of emission light. Meanwhile, for the active matrix type, the structure is with TFTs formed between the substrate and the color filters.

Incidentally, in this case, despite the obtained emission light colors are different, all the luminescent elements are formed by the organic compound layer to exhibit white emission light. Accordingly, there is no need to form an organic compound layer separately based on emission light color, thus eliminating the necessity of using a metal mask. Where deposition is possible without using a metal mask in this manner, there is no problem with metal-mask deformation due to heating. Accordingly, the substrate can be heated during deposition in addition to the light irradiation to the substrate surface in the invention. This can make the layer more compact as compared to the case only with light irradiation.

Figure 18B:
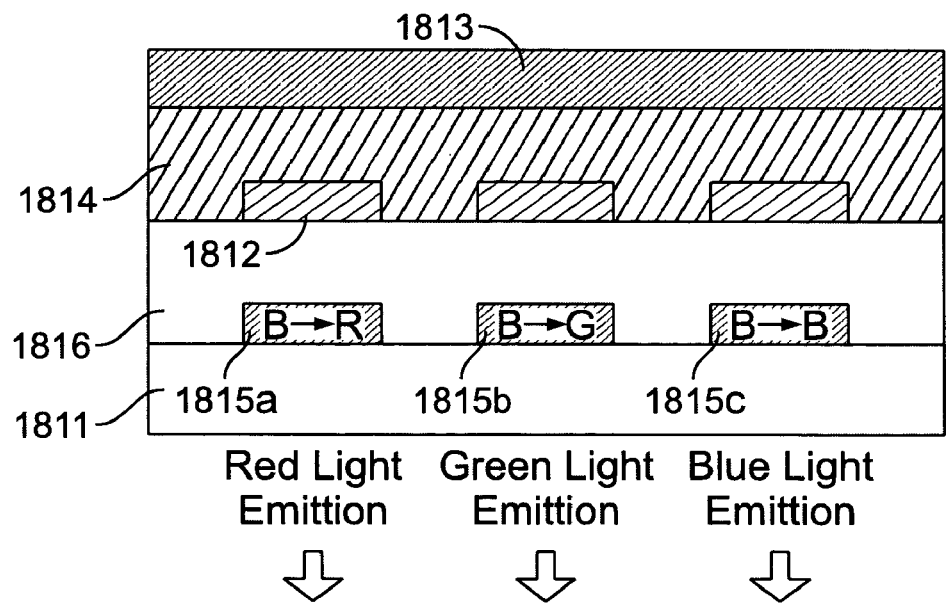

Next explained is a CCM (color changing mediums) method to be realized by combining a blue luminescent element having a blue luminescent organic compound layer with fluorescent color-converting layer, with reference to FIG. 18B.

In the CCM method, on a substrate 1811 the carriers injected from an anode 1812 and a cathode 1813 recombine in an organic compound layer 1814 to cause light (blue emission light) which excites a fluorescent color-converting layers 1815 formed underneath the anode 1812 through an insulating film 1816 so that conversion of blue to red (B→R), conversion of blue to green (B→G) and conversion of blue to blue (B→B) (note that the conversion of blue to blue may not be done) are made through the respective color converting layers 1815a, 1815b, and 1815c, thereby obtaining light emission in red, green and blue. In also the CCM method, the active matrix type is structured with TFTs formed between the substrate and the color filters.

Incidentally, because this case also does not require to form an organic compound layer separately, there is no need to use a metal mask. Consequently, where using the CCM method, the layer can be made compact by heating the substrate and irradiating light during deposition.

Meanwhile, where using the CCM method, there is a problem that, because the color-converting layer is fluorescent, it is possibly excited by external light to reduce contrast. It is preferred to raise contrast by attaching a color filter or so.

Incidentally, the other arts include a photo-breaching method. As discussed above, the luminescent element structured shown in this embodiment can be manufactured by the deposition apparatus and the method of the invention.

Embodiment 8

In this embodiment, the pixel portion structure of the luminescent device formed by a deposition apparatus of the present invention is described.

Figure 19A:
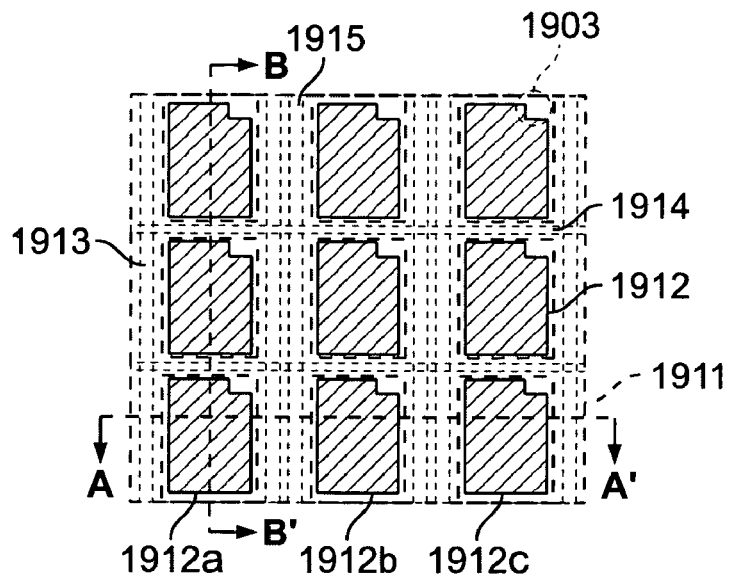
FIGS. 19A through 19C are views for explaining a structure of a pixel portion.

A part of the top surface view of a pixel portion 1911 is shown in FIG. 19A. The plural pixels 1912a to 1912c are formed in the pixel portion 1911. The top surface view shows the state of an insulating layer 1902 formed to cover the edge portion of the pixel electrode formed in a pixel. Thus, the insulating layer 1902 is formed to cover a source line 1913, a scanning line 1914 and a current supply line 1915. The insulating layer 1902 also covers the region a (1903) where connection portion between the pixel electrode and the TFT is formed at the bottom thereof.

Figure 19B:
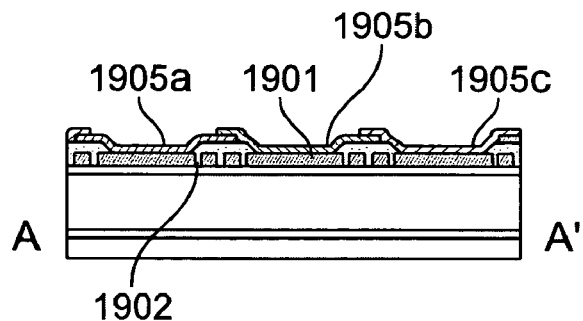

In addition, FIG. 19B shows a cross-section view taken along the dot line A-A' of the pixel portion 1911 shown in FIG. 19A and the state of forming organic compound layers 1905a to 19105c on the pixel electrode 1901. Further, the organic compound layer composed by same material is formed in the vertical direction to the drawing sheet, and the organic compound layer composed by different material is formed in the horizontal direction to the drawing sheet.

For example, the organic compound layer (R) 1905a emitted red light is formed in the pixel (R) 1912a, the organic compound layer (G) 1905b emitted green light is formed in the pixel (G) 1912*b* and the organic compound layer (B) 1905*c* emitted blue light is formed in the pixel (B) 1912*c*. The insulating film 1902 becomes a margin when the organic compound layer is formed. There is no problem if it is on the insulating film 1902 even if the deposition position of the organic compound layer shifts somewhat, and the organic compound layer composed by different material comes in succession on the insulating film 1902 as shown in FIG. 19B.

Figure 19C:
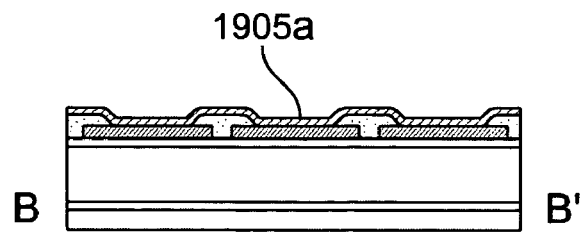

In addition, FIG. 19C shows a cross-section view taken along the dot line B-B' of the pixel portion 1911 shown in FIG. 19A and the state of forming the organic compound layer 1905*a* on the pixel electrode 1901 same as FIG. 19B.

The pixel taken along the dot line B-B' have a structure shown in FIG. 19C. because the organic compound layer (R) 1905*a* emitted red light same as the pixel (R) 1912*a* is formed in above-mentioned pixel.

Therefore, the organic compound layer (R) 1905*a* emitted red light, the organic compound layer (G) 1905*b* emitted green light and the organic compound layer (B) 1905*c* emitted blue light are formed in the pixel portion 1911. Thus, the full-color of the luminescent device can be realized.

As described above, by forming an organic compound layer for a luminescent element by using the deposition apparatus of the invention, it is possible to continuously form an organic compound layer having a plurality of function regions while irradiating light within the same deposition chamber. This makes it possible to make an organic compound layer more compact and prevent against contamination due to impurity at the interface between the function regions. Furthermore, where forming a mixed region by the present deposition apparatus, the energy barrier between organic layers at the function region interface is moderated to improve carrier injectability, making possible to form a luminescent element low in drive voltage but long in drive life.

What is claimed is:

1. A method of depositing a layer in a deposition apparatus, the deposition apparatus comprising:
   a load chamber;
   an alignment chamber;
   a first deposition chamber for forming an organic compound layer on a first electrode, prepared with a first and a second evaporation sources and a light source;
   a cleaning preliminary chamber;
   a second deposition chamber for forming a second electrode; and
   a sealing chamber,
   wherein the first evaporation source comprises a first organic compound; and
   wherein the second evaporation source comprises a second organic compound;
   the method comprising:
      forming a first function region comprising the first organic compound evaporated from the first evaporation source over the first electrode in the first deposition chamber during irradiation with light from the light source;
      forming a mixed region comprising the first organic compound evaporated from the first evaporation source and the second organic compound evaporated from the second evaporation source on the first function region in the first deposition chamber during irradiation with light from the light source;
      forming a second function region comprising the second organic compound evaporated from the second evaporation source but not from the first evaporation source on the mixed region in the first deposition chamber during irradiation with light from the light source.

2. A method of depositing a layer in a deposition apparatus, the deposition apparatus comprising:
   a load chamber;
   an alignment chamber;
   a first deposition chamber for forming an organic compound layer on a first electrode, prepared with a first and a second evaporation sources and a light source;
   a cleaning preliminary chamber;
   a second deposition chamber for forming a second electrode; and
   a sealing chamber,
   wherein the first evaporation source comprises a first organic compound; and
   wherein a second evaporation source comprises a second organic compound;
   the method comprising:
      forming a first function region comprising the first organic compound evaporated from the first evaporation source over the first electrode in the first deposition chamber;
      forming a mixed region comprising the first organic compound evaporated from the first evaporation source and the second organic compound evaporated from the second evaporation source on the first function region in the first deposition chamber during irradiation with light from the light source; and
      forming a second function region comprising the second organic compound evaporated from the second evaporation source but not from the first evaporation source on the mixed region in the first deposition chamber,
   wherein the mixed region includes organic compound molecules; and
   wherein the light is irradiated to the mixed region so as to activate the organic compound molecules and promote for compact film formation.

3. A method of depositing a layer according to claim 2, wherein a light irradiated from the light source is an ultraviolet ray.

4. A method of depositing a layer according to claim 2, wherein the light source is a low-pressure mercury lamp.

5. A method of depositing a layer according to claim 2, wherein a light irradiated from the light source has a wavelength of 100 nm to 300 nm.

* * * * *